US012775507B2

(12) United States Patent
Kumar et al.

(10) Patent No.: US 12,775,507 B2
(45) Date of Patent: *Oct. 27, 2026

(54) TECHNOLOGIES FOR PROVIDING EFFICIENT POOLING FOR A HYPER CONVERGED INFRASTRUCTURE

(71) Applicant: Intel Corporation, Santa Clara, CA (US)

(72) Inventors: Mohan J. Kumar, Aloha, OR (US); Murugasamy K. Nachimuthu, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 537 days.

This patent is subject to a terminal disclaimer.

(21) Appl. No.: 18/219,557

(22) Filed: Jul. 7, 2023

(65) Prior Publication Data

US 2023/0418686 A1 Dec. 28, 2023

Related U.S. Application Data

(63) Continuation of application No. 15/858,542, filed on Dec. 29, 2017, now Pat. No. 11,748,172.

(Continued)

(30) Foreign Application Priority Data

Aug. 30, 2017 (IN) ............................ 201741030632

(51) Int. Cl.

*G06F 9/44* (2018.01)
*G06F 1/183* (2026.01)

(Continued)

(52) U.S. Cl.

CPC ............ *G06F 9/5088* (2013.01); *G06F 1/183* (2013.01); *G06F 9/5016* (2013.01);

(Continued)

(58) Field of Classification Search

CPC .... G06F 9/5088; G06F 9/5016; G06F 9/4856; G06F 1/183; G06F 11/3442; G06F 2209/402

See application file for complete search history.

(56) References Cited

U.S. PATENT DOCUMENTS 6,230,265 B1 5/2001 Ahrens et al.
6,948,001 B1 * 9/2005 Bradley .............. H04L 67/1097 710/65

(Continued)

OTHER PUBLICATIONS

First Chinese Office Action of P.R. China State Intellectual Property Office for Patent Application No. 201810845565.8, Mailed Dec. 13, 2024, 9 pages.

(Continued)

*Primary Examiner* — Diem K Cao
(74) *Attorney, Agent, or Firm* — Compass IP Law PC

(57) ABSTRACT

Technologies for providing efficient pooling for a system that includes a hyper converged infrastructure. A sled of the system includes a network interface controller that includes a first bridge logic unit to communicatively couple to a network of bridge logic units. The first bridge logic unit is further to obtain, from a requestor device, a request to access a requested device, determine whether the requested device is on the present sled or on a remote sled different from the present sled, selectively power on, in response to a determination that the requested device is located on the present sled, the requested device, communicate, in response to a determination that the requested device is on the remote sled, with a second bridge logic unit of the remote sled, and provide, to the requestor device through the first bridge logic unit, access to the requested device

19 Claims, 20 Drawing Sheets

Related U.S. Application Data

(60) Provisional application No. 62/584,401, filed on Nov. 10, 2017.

(51) Int. Cl.

| | |
|---|---|
| ***G06F 9/50*** | (2006.01) |
| ***G06F 11/34*** | (2006.01) |
| *G06F 9/48* | (2006.01) |
| *G06N 3/063* | (2023.01) |
| *G06Q 30/0283* | (2023.01) |
| *H04L 49/40* | (2022.01) |
| *H05K 7/14* | (2006.01) |

(52) U.S. Cl.

CPC ........ *G06F 11/3442* (2013.01); *G06F 9/4856* (2013.01); *G06F 2209/502* (2013.01); *G06N 3/063* (2013.01); *G06Q 30/0283* (2013.01); *H04L 49/40* (2013.01); *H05K 7/1498* (2013.01)

(56) References Cited

U.S. PATENT DOCUMENTS

| | | | |
|---|---|---|---|
| 7,472,211 | B2 | 12/2008 | Kawai et al. |
| 8,010,565 | B2 | 8/2011 | Gujarathi et al. |
| 8,140,719 | B2 | 3/2012 | Lauterbach et al. |
| 8,214,467 | B2 | 7/2012 | Dake et al. |
| 8,225,159 | B1 | 7/2012 | Coatney et al. |
| 8,755,176 | B2 | 6/2014 | Davis et al. |
| 8,762,668 | B2 | 6/2014 | Taguchi et al. |
| 8,798,045 | B1 | 8/2014 | Aybay et al. |
| 8,824,222 | B2 | 9/2014 | Ware et al. |
| 9,081,828 | B1 | 7/2015 | Martin et al. |
| 9,098,451 | B1 | 8/2015 | Rakitzis et al. |
| 9,104,562 | B2 | 8/2015 | Dorfner et al. |
| 9,276,900 | B1 | 3/2016 | Daud et al. |
| 9,317,336 | B2 | 4/2016 | Alicherry |
| 9,367,360 | B2 | 6/2016 | Jubran et al. |
| 9,413,713 | B2 | 8/2016 | Jain et al. |
| 9,477,279 | B1 | 10/2016 | Piszczek et al. |
| 9,503,391 | B2 | 11/2016 | Xia et al. |
| 9,582,010 | B2 | 2/2017 | Mick et al. |
| 9,645,902 | B2 | 5/2017 | Breakstone et al. |
| 9,696,781 | B2 | 7/2017 | Baker |
| 9,696,942 | B2 * | 7/2017 | Kagan .................. G06F 3/0607 |
| 9,858,104 | B2 | 1/2018 | Tripathi et al. |
| 9,892,079 | B2 | 2/2018 | Ganth et al. |
| 9,929,960 | B1 | 3/2018 | Abts et al. |
| 9,965,351 | B2 | 5/2018 | Arslan et al. |
| 10,019,388 | B2 | 7/2018 | Long et al. |
| 10,108,560 | B1 | 10/2018 | Lamb et al. |
| 10,127,107 | B2 | 11/2018 | Singh et al. |
| 10,162,793 | B1 | 12/2018 | BShara et al. |
| 10,310,756 | B2 | 6/2019 | Yu et al. |
| 10,348,574 | B2 | 7/2019 | Kulkarni et al. |
| 10,355,939 | B2 | 7/2019 | Schmatz |
| 10,467,052 | B2 | 11/2019 | Chen et al. |
| 2004/0073834 | A1 | 4/2004 | Kermaani et al. |
| 2006/0067318 | A1 | 3/2006 | Gorodetsky et al. |
| 2014/0122634 | A1 | 5/2014 | Conner et al. |
| 2014/0317267 | A1 | 10/2014 | Ramachandran et al. |
| 2014/0337496 | A1 | 11/2014 | Ramachandran et al. |
| 2015/0089037 | A1 | 3/2015 | Tsirkin et al. |
| 2015/0269116 | A1 | 9/2015 | Raikin et al. |
| 2015/0334206 | A1 | 11/2015 | Hung |
| 2016/0321200 | A1 | 11/2016 | Long et al. |
| 2017/0293447 | A1 | 10/2017 | Bivens et al. |
| 2018/0007127 | A1 | 1/2018 | Salapura et al. |
| 2018/0027681 | A1 | 1/2018 | Davis et al. |
| 2018/0034908 | A1 | 2/2018 | Li |
| 2018/0288152 | A1 | 10/2018 | Reddy et al. |
| 2018/0293184 | A1 | 10/2018 | Dropps et al. |
| 2019/0166032 | A1 | 5/2019 | Inbaraj et al. |

OTHER PUBLICATIONS

Advisory Action for U.S. Appl. No. 15/858,542, Mailed Sep. 1, 2022, 6 pages.

Final Office Action for U.S. Appl. No. 15/858,542, Mailed Jun. 10, 2021, 17 pages.

Final Office Action for U.S. Appl. No. 15/858,542, Mailed May 26, 2022, 19 pages.

J. Weerasinghe et al., "Disaggregated FPGAs: Network Performance Comparison against Bare-Metal Servers, Virtual Machines and Linux Containers," 2016 IEEE International Conference on Cloud Computing Technology and Science (CloudCom), 2016, pp. 9-17, doi: 10.1109/Cloud (Year: 2016).

K. Katrinis et al., "Rack-scale disaggregated cloud data centers: The dReDBox project vision," 2016 Design, Automation & Test in Europe Conference & Exhibition (DATE), 2016, pp. 690-695. (Year: 2016).

Office Action for U.S. Appl. No. 15/858,542, Mailed Dec. 22, 2022, 18 pages.

Office Action for U.S. Appl. No. 15/858,542, Mailed Nov. 27, 2020, 23 pages.

Office Action for U.S. Appl. No. 15/858,542, Mailed Sep. 16, 2021, 19 pages.

* cited by examiner

TECHNOLOGIES FOR PROVIDING EFFICIENT POOLING FOR A HYPER CONVERGED INFRASTRUCTURE

CROSS-REFERENCE TO RELATED APPLICATIONS

This application is a continuation of U.S. patent application Ser. No. 15/858,542, filed Dec. 29, 2017 which claims the benefit of Indian Provisional Patent Application No. 201741030632, filed Aug. 30, 2017 and U.S. Provisional Patent Application No. 62/584,401, filed Nov. 10, 2017. The entire specifications of which are hereby incorporated herein by reference in their entirety.

BACKGROUND

Use of pooling (e.g. providing a collection of resources such as accelerator devices, memory devices, or data storage devices that are connected to and usable by one or more compute devices in a rack or across multiple racks) in a hyper converged infrastructure is becoming more prevalent within data centers. However, typically each sled (e.g., a board having one or more resources) in such systems is completely powered on (e.g., the main processor and devices connected through to I/O subsystem) to enable access to any particular device located on the sled. In situations in which a small subset of the resources (e.g., a particular memory device) located on a sled is being used to execute a workload (e.g., an application) while the other devices are idle, the energy consumed to keep the other devices of the sled powered on during the execution of the workload (e.g., to enable access to the subset of the resources on the sled) is wasted and adds to the financial cost of operating the data center.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
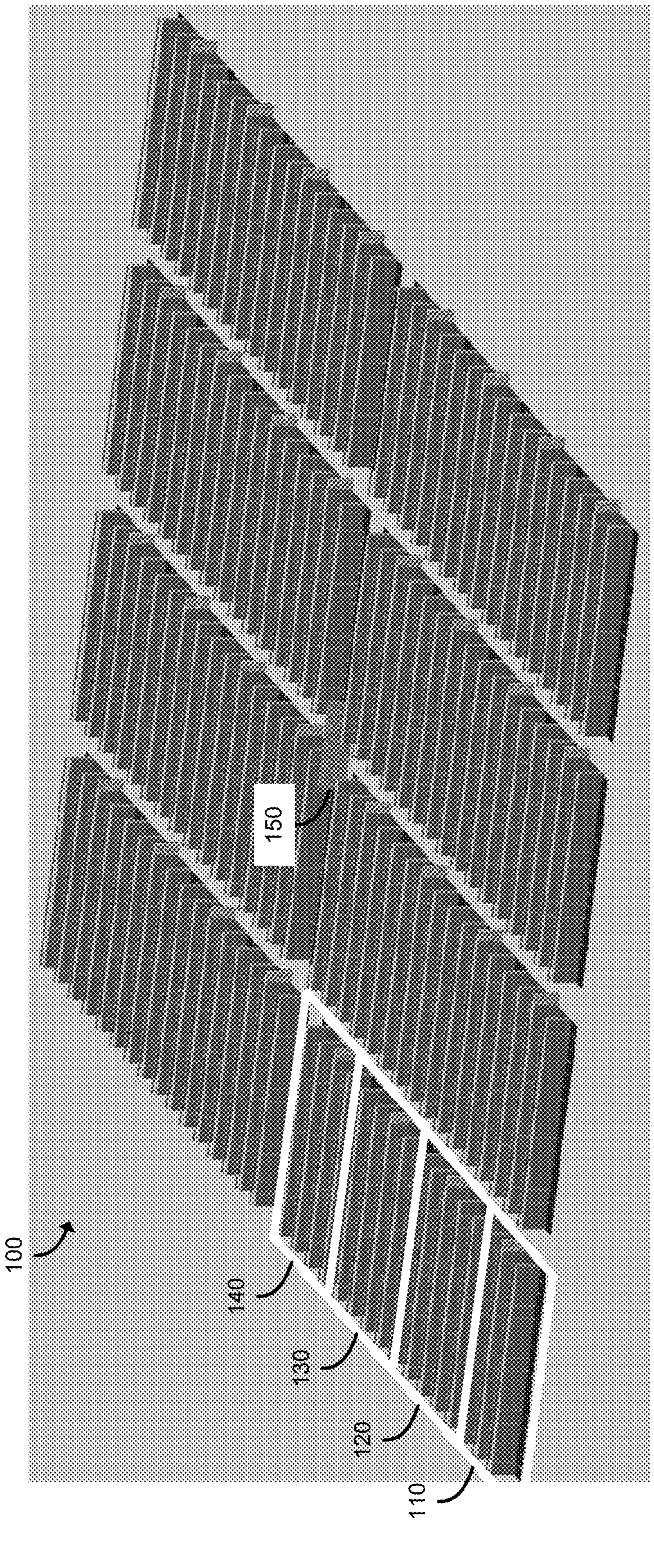
FIG. 1 is a simplified diagram of at least one embodiment of a data center for executing workloads with disaggregated resources.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a data center 100 in which disaggregated resources may cooperatively execute one or more workloads (e.g., applications on behalf of customers) includes multiple pods 110, 120, 130, 140, each of which includes one or more rows of racks. As described in more detail herein, each rack houses multiple sleds, which each may be embodied as a compute device, such as a server, that is primarily equipped with a particular type of resource (e.g., memory devices, data storage devices, accelerator devices, general purpose processors). In the illustrative embodiment, the sleds in each pod 110, 120, 130, 140 are connected to multiple pod switches (e.g., switches that route data communications to and from sleds within the pod). The pod switches, in turn, connect with spine switches 150 that switch communications among pods (e.g., the pods 110, 120, 130, 140) in the data center 100. In some embodiments, the sleds may be connected with a fabric using Intel Omni-Path technology. As described in more detail herein, resources within sleds in the data center 100 may be allocated to a group (referred to herein as a "managed node") containing resources from one or more other sleds to be collectively utilized in the execution of a workload. The workload can execute as if the resources belonging to the managed node were located on the same sled. The resources in a managed node may even belong to sleds belonging to different racks, and even to different pods 110, 120, 130, 140. Some resources of a single sled may be allocated to one managed node while other resources of the same sled are allocated to a different managed node (e.g., one processor assigned to one managed node and another processor of the same sled assigned to a different managed node). By disaggregating resources to sleds comprised predominantly of a single type of resource (e.g., compute sleds comprising primarily compute resources, memory sleds containing primarily memory resources), and selectively allocating and deallocating the disaggregated resources to form a managed node assigned to execute a workload, the data center 100 provides more efficient resource usage over typical data centers comprised of hyperconverged servers containing compute, memory, storage and perhaps additional resources). As such, the data center 100 may provide greater performance (e.g., throughput, operations per second, latency, etc.) than a typical data center that has the same number of resources.

Figure 2:
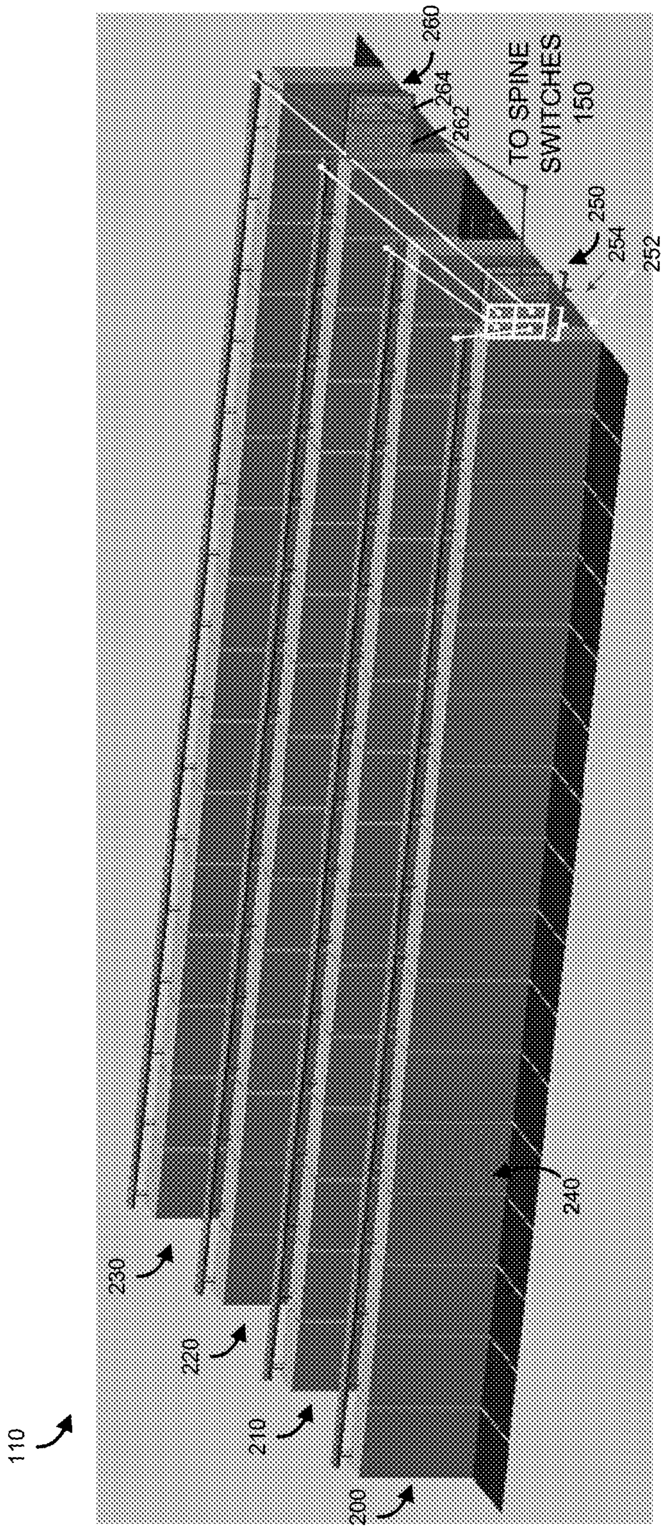
FIG. 2 is a simplified diagram of at least one embodiment of a pod of the data center of FIG. 1.

Referring now to FIG. 2, the pod 110, in the illustrative embodiment, includes a set of rows 200, 210, 220, 230 of racks 240. Each rack 240 may house multiple sleds (e.g., sixteen sleds) and provide power and data connections to the housed sleds, as described in more detail herein. In the illustrative embodiment, the racks in each row 200, 210, 220, 230 are connected to multiple pod switches 250, 260. The pod switch 250 includes a set of ports 252 to which the sleds of the racks of the pod 110 are connected and another set of ports 254 that connect the pod 110 to the spine switches 150 to provide connectivity to other pods in the data center 100. Similarly, the pod switch 260 includes a set of ports 262 to which the sleds of the racks of the pod 110 are connected and a set of ports 264 that connect the pod 110 to the spine switches 150. As such, the use of the pair of switches 250, 260 provides an amount of redundancy to the pod 110. For example, if either of the switches 250, 260 fails, the sleds in the pod 110 may still maintain data communication with the remainder of the data center 100 (e.g., sleds of other pods) through the other switch 250, 260. Furthermore, in the illustrative embodiment, the switches 150, 250, 260 may be embodied as dual-mode optical switches, capable of routing both Ethernet protocol communications carrying Internet Protocol (IP) packets and communications according to a second, high-performance link-layer protocol (e.g., Intel's Omni-Path Architecture's, Infiniband) via optical signaling media of an optical fabric.

It should be appreciated that each of the other pods 120, 130, 140 (as well as any additional pods of the data center 100) may be similarly structured as, and have components similar to, the pod 110 shown in and described in regard to FIG. 2 (e.g., each pod may have rows of racks housing multiple sleds as described above). Additionally, while two pod switches 250, 260 are shown, it should be understood that in other embodiments, each pod 110, 120, 130, 140 may be connected to different number of pod switches (e.g., providing even more failover capacity).

Figure 3:
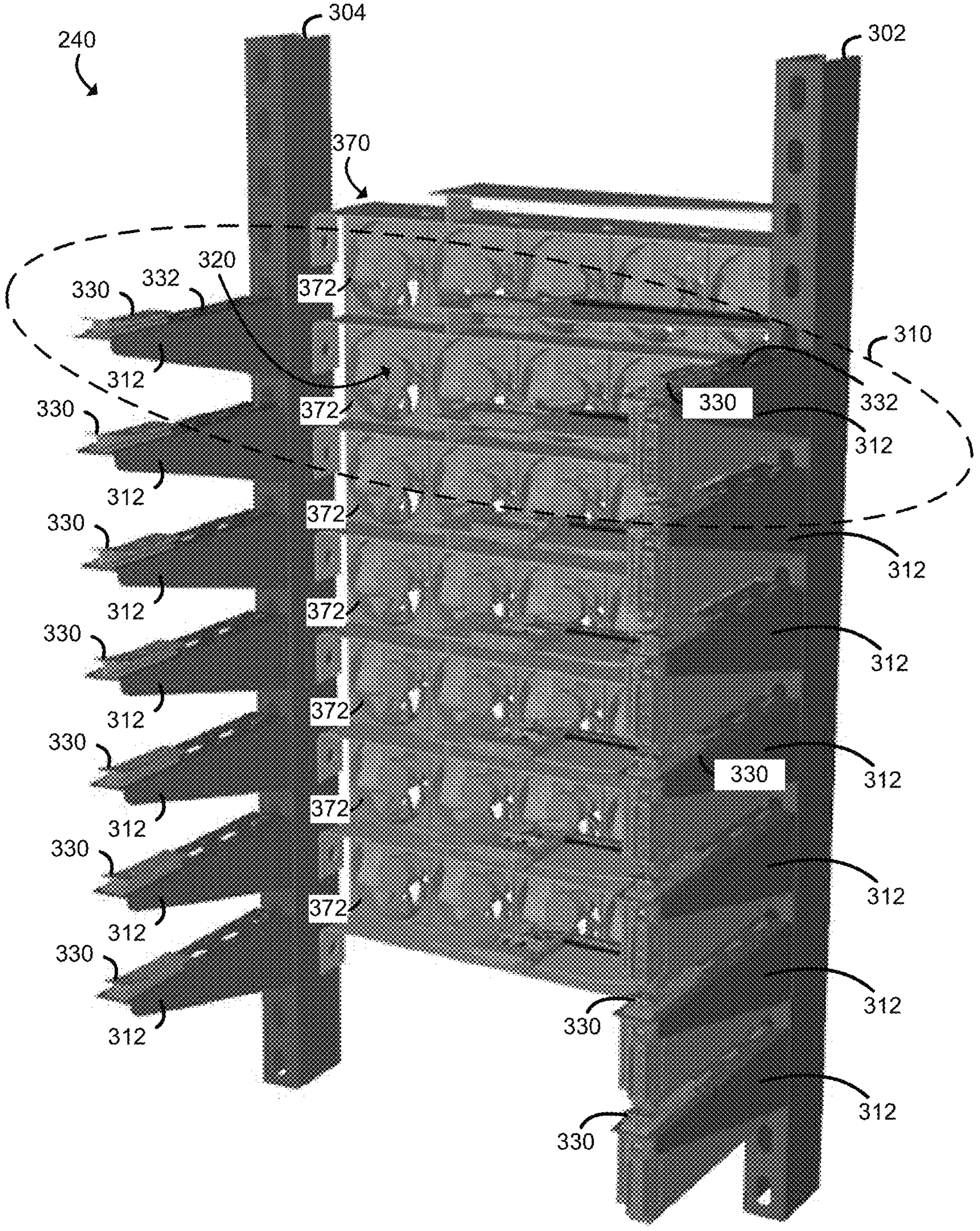
FIG. 3 is a perspective view of at least one embodiment of a rack that may be included in the pod of FIG. 2.
Figure 4:
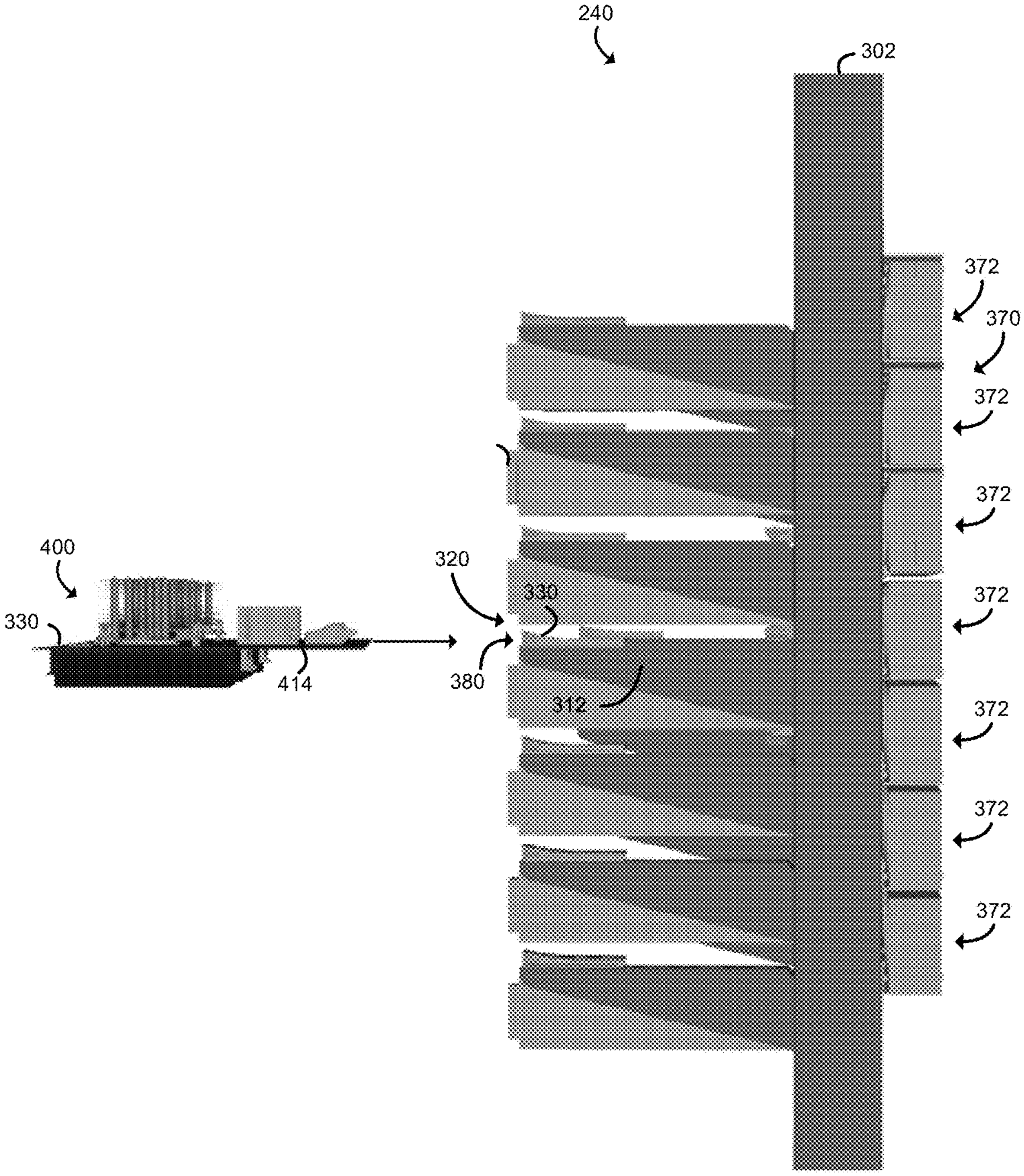
FIG. 4 is a side plan elevation view of the rack of FIG. 3.
Figure 5:
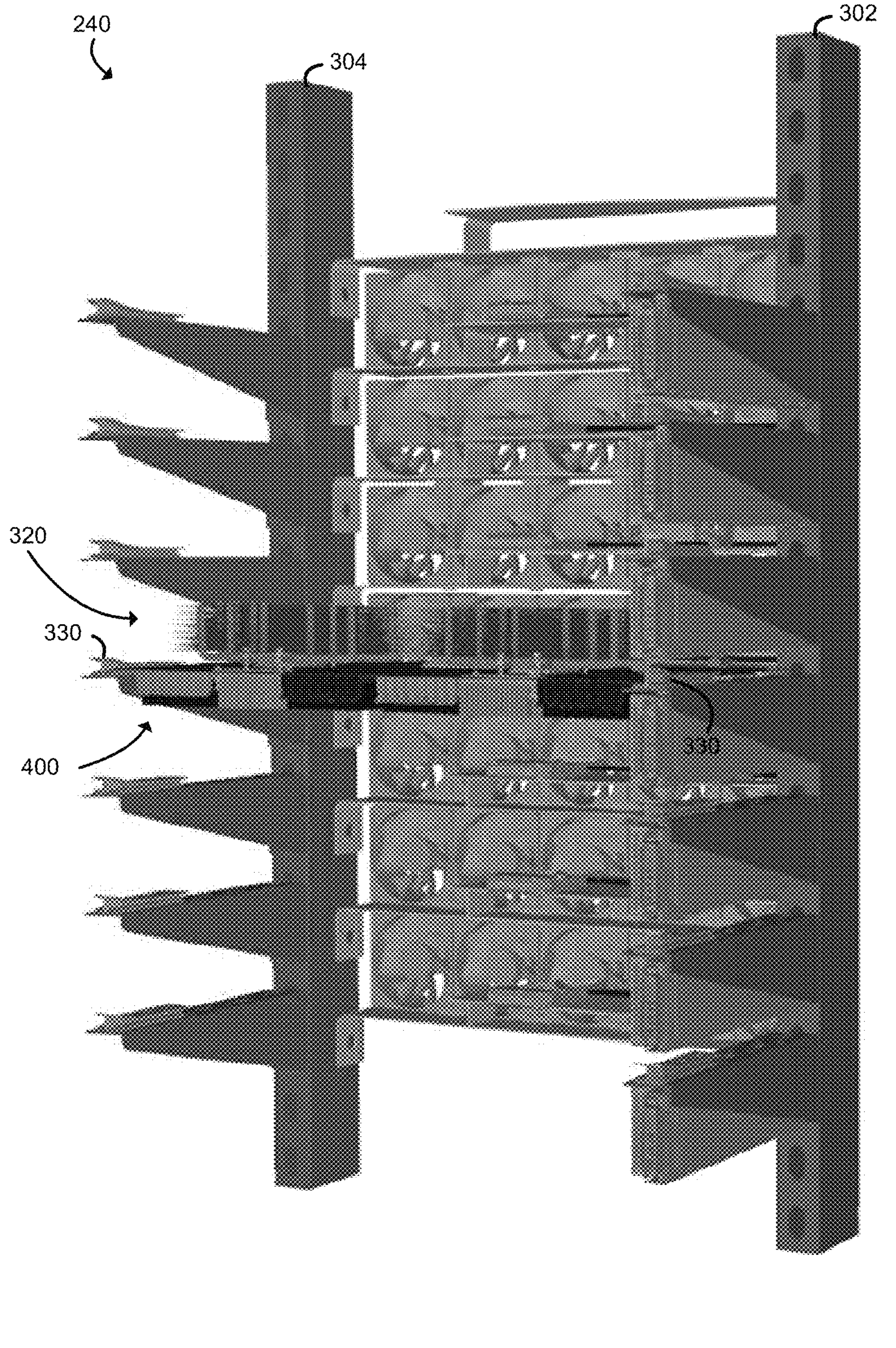
FIG. 5 is a perspective view of the rack of FIG. 3 having a sled mounted therein.

Referring now to FIGS. 3-5, each illustrative rack 240 of the data center 100 includes two elongated support posts 302, 304, which are arranged vertically. For example, the elongated support posts 302, 304 may extend upwardly from a floor of the data center 100 when deployed. The rack 240 also includes one or more horizontal pairs 310 of elongated support arms 312 (identified in FIG. 3 via a dashed ellipse) configured to support a sled of the data center 100 as discussed below. One elongated support arm 312 of the pair of elongated support arms 312 extends outwardly from the elongated support post 302 and the other elongated support arm 312 extends outwardly from the elongated support post 304.

In the illustrative embodiments, each sled of the data center 100 is embodied as a chassis-less sled. That is, each sled has a chassis-less circuit board substrate on which physical resources (e.g., processors, memory, accelerators, storage, etc.) are mounted as discussed in more detail below. As such, the rack 240 is configured to receive the chassis-less sleds. For example, each pair 310 of elongated support arms 312 defines a sled slot 320 of the rack 240, which is configured to receive a corresponding chassis-less sled. To do so, each illustrative elongated support arm 312 includes a circuit board guide 330 configured to receive the chassis-less circuit board substrate of the sled. Each circuit board guide 330 is secured to, or otherwise mounted to, a top side 332 of the corresponding elongated support arm 312. For example, in the illustrative embodiment, each circuit board guide 330 is mounted at a distal end of the corresponding elongated support arm 312 relative to the corresponding elongated support post 302, 304. For clarity of the Figures, not every circuit board guide 330 may be referenced in each Figure.

Each circuit board guide 330 includes an inner wall that defines a circuit board slot 380 configured to receive the chassis-less circuit board substrate of a sled 400 when the sled 400 is received in the corresponding sled slot 320 of the rack 240. To do so, as shown in FIG. 4, a user (or robot) aligns the chassis-less circuit board substrate of an illustrative chassis-less sled 400 to a sled slot 320. The user, or robot, may then slide the chassis-less circuit board substrate forward into the sled slot 320 such that each side edge 414 of the chassis-less circuit board substrate is received in a corresponding circuit board slot 380 of the circuit board guides 330 of the pair 310 of elongated support arms 312 that define the corresponding sled slot 320 as shown in FIG. 4. By having robotically accessible and robotically manipulable sleds comprising disaggregated resources, each type of resource can be upgraded independently of each other and at their own optimized refresh rate. Furthermore, the sleds are configured to blindly mate with power and data communication cables in each rack 240, enhancing their ability to be quickly removed, upgraded, reinstalled, and/or replaced. As such, in some embodiments, the data center 100 may operate (e.g., execute workloads, undergo maintenance and/or upgrades, etc.) without human involvement on the data center floor. In other embodiments, a human may facilitate one or more maintenance or upgrade operations in the data center 100.

It should be appreciated that each circuit board guide 330 is dual sided. That is, each circuit board guide 330 includes an inner wall that defines a circuit board slot 380 on each side of the circuit board guide 330. In this way, each circuit board guide 330 can support a chassis-less circuit board substrate on either side. As such, a single additional elongated support post may be added to the rack 240 to turn the rack 240 into a two-rack solution that can hold twice as many sled slots 320 as shown in FIG. 3. The illustrative rack 240 includes seven pairs 310 of elongated support arms 312 that define a corresponding seven sled slots 320, each configured to receive and support a corresponding sled 400 as discussed above. Of course, in other embodiments, the rack 240 may include additional or fewer pairs 310 of elongated support arms 312 (i.e., additional or fewer sled slots 320). It should be appreciated that because the sled 400 is chassis-less, the sled 400 may have an overall height that is different than typical servers. As such, in some embodiments, the height of each sled slot 320 may be shorter than the height of a typical server (e.g., shorter than a single rank unit, "1U"). That is, the vertical distance between each pair 310 of elongated support arms 312 may be less than a standard rack unit "1U." Additionally, due to the relative decrease in height of the sled slots 320, the overall height of the rack 240 in some embodiments may be shorter than the height of traditional rack enclosures. For example, in some embodiments, each of the elongated support posts 302, 304 may have a length of six feet or less. Again, in other embodiments, the rack 240 may have different dimensions. Further, it should be appreciated that the rack 240 does not include any walls, enclosures, or the like. Rather, the rack 240 is an enclosure-less rack that is opened to the local environment. Of course, in some cases, an end plate may be attached to one of the elongated support posts 302, 304 in those situations in which the rack 240 forms an end-of-row rack in the data center 100.

In some embodiments, various interconnects may be routed upwardly or downwardly through the elongated support posts 302, 304. To facilitate such routing, each elongated support post 302, 304 includes an inner wall that defines an inner chamber in which the interconnect may be located. The interconnects routed through the elongated support posts 302, 304 may be embodied as any type of interconnects including, but not limited to, data or communication interconnects to provide communication connections to each sled slot 320, power interconnects to provide power to each sled slot 320, and/or other types of interconnects.

The rack 240, in the illustrative embodiment, includes a support platform on which a corresponding optical data connector (not shown) is mounted. Each optical data connector is associated with a corresponding sled slot 320 and is configured to mate with an optical data connector of a corresponding sled 400 when the sled 400 is received in the corresponding sled slot 320. In some embodiments, optical connections between components (e.g., sleds, racks, and switches) in the data center 100 are made with a blind mate optical connection. For example, a door on each cable may prevent dust from contaminating the fiber inside the cable. In the process of connecting to a blind mate optical connector mechanism, the door is pushed open when the end of the cable enters the connector mechanism. Subsequently, the optical fiber inside the cable enters a gel within the connector mechanism and the optical fiber of one cable comes into contact with the optical fiber of another cable within the gel inside the connector mechanism.

The illustrative rack 240 also includes a fan array 370 coupled to the cross-support arms of the rack 240. The fan array 370 includes one or more rows of cooling fans 372, which are aligned in a horizontal line between the elongated support posts 302, 304. In the illustrative embodiment, the fan array 370 includes a row of cooling fans 372 for each sled slot 320 of the rack 240. As discussed above, each sled 400 does not include any on-board cooling system in the illustrative embodiment and, as such, the fan array 370 provides cooling for each sled 400 received in the rack 240. Each rack 240, in the illustrative embodiment, also includes a power supply associated with each sled slot 320. Each power supply is secured to one of the elongated support arms 312 of the pair 310 of elongated support arms 312 that define the corresponding sled slot 320. For example, the rack 240 may include a power supply coupled or secured to each elongated support arm 312 extending from the elongated support post 302. Each power supply includes a power connector configured to mate with a power connector of the sled 400 when the sled 400 is received in the corresponding sled slot 320. In the illustrative embodiment, the sled 400 does not include any on-board power supply and, as such, the power supplies provided in the rack 240 supply power to corresponding sleds 400 when mounted to the rack 240.

Figure 6:
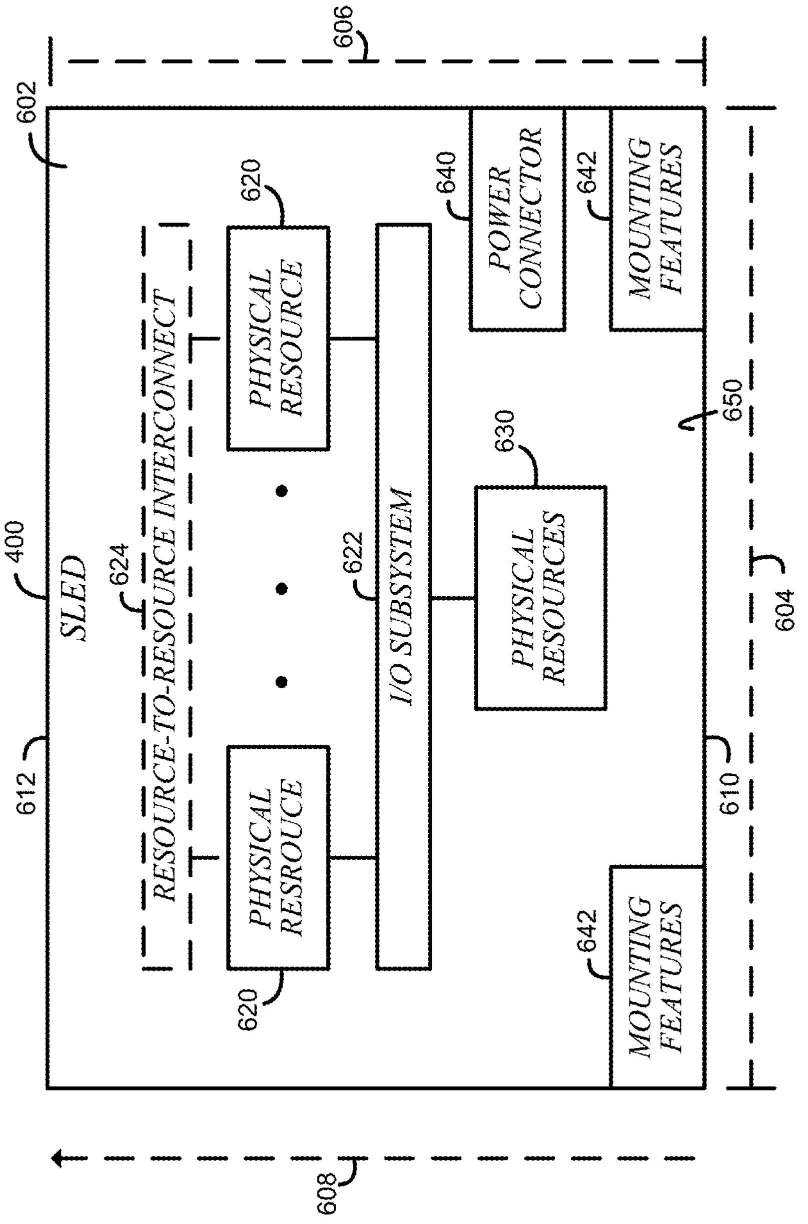
FIG. 6 is a is a simplified block diagram of at least one embodiment of a top side of the sled of FIG. 5.

Referring now to FIG. 6, the sled 400, in the illustrative embodiment, is configured to be mounted in a corresponding rack 240 of the data center 100 as discussed above. In some embodiments, each sled 400 may be optimized or otherwise configured for performing particular tasks, such as compute tasks, acceleration tasks, data storage tasks, etc. For example, the sled 400 may be embodied as a compute sled 800 as discussed below in regard to FIGS. 8-9, an accelerator sled 1000 as discussed below in regard to FIGS. 10-11, a storage sled 1200 as discussed below in regard to FIGS. 12-13, or as a sled optimized or otherwise configured to perform other specialized tasks, such as a memory sled 1400, discussed below in regard to FIG. 14.

As discussed above, the illustrative sled 400 includes a chassis-less circuit board substrate 602, which supports various physical resources (e.g., electrical components) mounted thereon. It should be appreciated that the circuit board substrate 602 is "chassis-less" in that the sled 400 does not include a housing or enclosure. Rather, the chassis-less circuit board substrate 602 is open to the local environment. The chassis-less circuit board substrate 602 may be formed from any material capable of supporting the various electrical components mounted thereon. For example, in an illustrative embodiment, the chassis-less circuit board substrate 602 is formed from an FR-4 glass-reinforced epoxy laminate material. Of course, other materials may be used to form the chassis-less circuit board substrate 602 in other embodiments.

As discussed in more detail below, the chassis-less circuit board substrate 602 includes multiple features that improve the thermal cooling characteristics of the various electrical components mounted on the chassis-less circuit board substrate 602. As discussed, the chassis-less circuit board substrate 602 does not include a housing or enclosure, which may improve the airflow over the electrical components of the sled 400 by reducing those structures that may inhibit air flow. For example, because the chassis-less circuit board substrate 602 is not positioned in an individual housing or enclosure, there is no backplane (e.g., a backplate of the chassis) to the chassis-less circuit board substrate 602, which could inhibit air flow across the electrical components. Additionally, the chassis-less circuit board substrate 602 has a geometric shape configured to reduce the length of the airflow path across the electrical components mounted to the chassis-less circuit board substrate 602. For example, the illustrative chassis-less circuit board substrate 602 has a width 604 that is greater than a depth 606 of the chassis-less circuit board substrate 602. In one particular embodiment, for example, the chassis-less circuit board substrate 602 has a width of about 21 inches and a depth of about 9 inches, compared to a typical server that has a width of about 17 inches and a depth of about 39 inches. As such, an airflow path 608 that extends from a front edge 610 of the chassis-less circuit board substrate 602 toward a rear edge 612 has a shorter distance relative to typical servers, which may improve the thermal cooling characteristics of the sled 400. Furthermore, although not illustrated in FIG. 6, the various physical resources mounted to the chassis-less circuit board substrate 602 are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 602 linearly in-line with each other along the direction of the airflow path 608 (i.e., along a direction extending from the front edge 610 toward the rear edge 612 of the chassis-less circuit board substrate 602).

As discussed above, the illustrative sled 400 includes one or more physical resources 620 mounted to a top side 650 of the chassis-less circuit board substrate 602. Although two physical resources 620 are shown in FIG. 6, it should be appreciated that the sled 400 may include one, two, or more physical resources 620 in other embodiments. The physical resources 620 may be embodied as any type of processor, controller, or other compute circuit capable of performing various tasks such as compute functions and/or controlling the functions of the sled 400 depending on, for example, the type or intended functionality of the sled 400. For example, as discussed in more detail below, the physical resources 620 may be embodied as high-performance processors in embodiments in which the sled 400 is embodied as a compute sled, as accelerator co-processors or circuits in embodiments in which the sled 400 is embodied as an accelerator sled, storage controllers in embodiments in which the sled 400 is embodied as a storage sled, or a set of memory devices in embodiments in which the sled 400 is embodied as a memory sled.

The sled 400 also includes one or more additional physical resources 630 mounted to the top side 650 of the chassis-less circuit board substrate 602. In the illustrative embodiment, the additional physical resources include a network interface controller (NIC) as discussed in more detail below. Of course, depending on the type and functionality of the sled 400, the physical resources 630 may include additional or other electrical components, circuits, and/or devices in other embodiments.

The physical resources 620 are communicatively coupled to the physical resources 630 via an input/output (I/O) subsystem 622. The I/O subsystem 622 may be embodied as circuitry and/or components to facilitate input/output operations with the physical resources 620, the physical resources 630, and/or other components of the sled 400. For example, the I/O subsystem 622 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In the illustrative embodiment, the I/O subsystem 622 is embodied as, or otherwise includes, a double data rate 4 (DDR4) data bus or a DDR5 data bus.

In some embodiments, the sled 400 may also include a resource-to-resource interconnect 624. The resource-to-resource interconnect 624 may be embodied as any type of communication interconnect capable of facilitating resource-to-resource communications. In the illustrative embodiment, the resource-to-resource interconnect 624 is embodied as a high-speed point-to-point interconnect (e.g., faster than the I/O subsystem 622). For example, the resource-to-resource interconnect 624 may be embodied as a QuickPath Interconnect (QPI), an UltraPath Interconnect (UPI), or other high-speed point-to-point interconnect dedicated to resource-to-resource communications.

The sled 400 also includes a power connector 640 configured to mate with a corresponding power connector of the rack 240 when the sled 400 is mounted in the corresponding rack 240. The sled 400 receives power from a power supply of the rack 240 via the power connector 640 to supply power to the various electrical components of the sled 400. That is, the sled 400 does not include any local power supply (i.e., an on-board power supply) to provide power to the electrical components of the sled 400. The exclusion of a local or on-board power supply facilitates the reduction in the overall footprint of the chassis-less circuit board substrate 602, which may increase the thermal cooling characteristics of the various electrical components mounted on the chassis-less circuit board substrate 602 as discussed above. In some embodiments, power is provided to the processors 820 through vias directly under the processors 820 (e.g., through the bottom side 750 of the chassis-less circuit board substrate 602), providing an increased thermal budget, additional current and/or voltage, and better voltage control over typical boards.

In some embodiments, the sled 400 may also include mounting features 642 configured to mate with a mounting arm, or other structure, of a robot to facilitate the placement of the sled 600 in a rack 240 by the robot. The mounting features 642 may be embodied as any type of physical structures that allow the robot to grasp the sled 400 without damaging the chassis-less circuit board substrate 602 or the electrical components mounted thereto. For example, in some embodiments, the mounting features 642 may be embodied as non-conductive pads attached to the chassis-less circuit board substrate 602. In other embodiments, the mounting features may be embodied as brackets, braces, or other similar structures attached to the chassis-less circuit board substrate 602. The particular number, shape, size, and/or make-up of the mounting feature 642 may depend on the design of the robot configured to manage the sled 400.

Figure 7:
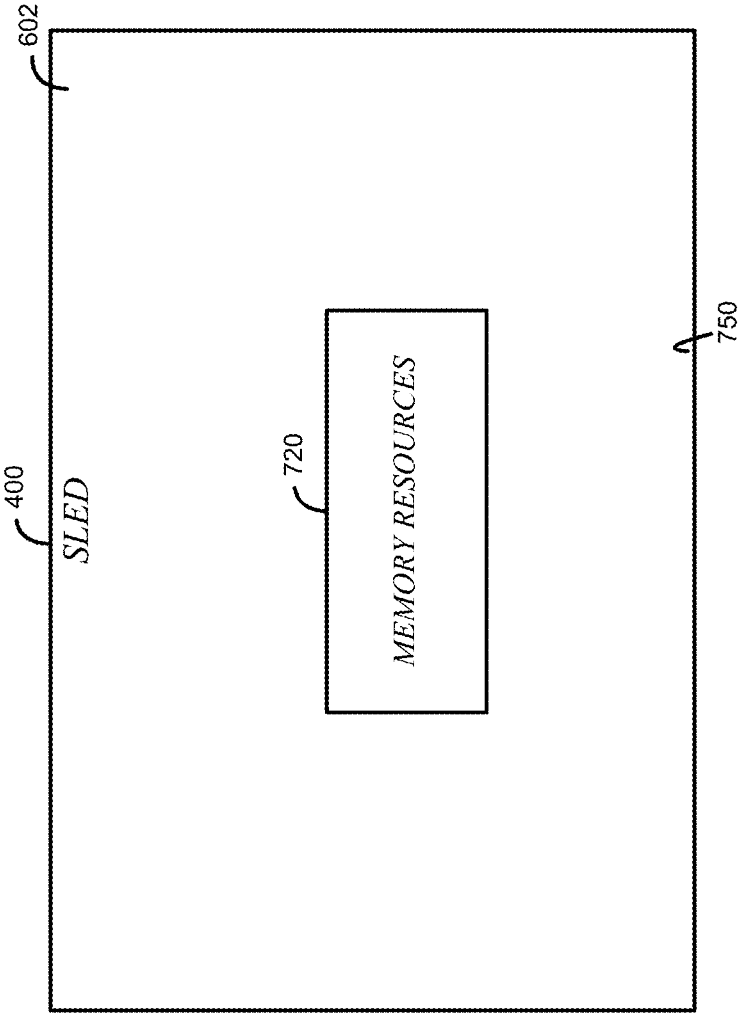
FIG. 7 is a simplified block diagram of at least one embodiment of a bottom side of the sled of FIG. 6.

Referring now to FIG. 7, in addition to the physical resources 630 mounted on the top side 650 of the chassis-less circuit board substrate 602, the sled 400 also includes one or more memory devices 720 mounted to a bottom side 750 of the chassis-less circuit board substrate 602. That is, the chassis-less circuit board substrate 602 is embodied as a double-sided circuit board. The physical resources 620 are communicatively coupled to the memory devices 720 via the I/O subsystem 622. For example, the physical resources 620 and the memory devices 720 may be communicatively coupled by one or more vias extending through the chassis-less circuit board substrate 602. Each physical resource 620 may be communicatively coupled to a different set of one or more memory devices 720 in some embodiments. Alternatively, in other embodiments, each physical resource 620 may be communicatively coupled to each memory devices 720.

The memory devices 720 may be embodied as any type of memory device capable of storing data for the physical resources 620 during operation of the sled 400, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, the memory device may comprise a transistor-less stackable cross point architecture in which memory cells sit at the intersection of word lines and bit lines and are individually addressable and in which bit storage is based on a change in bulk resistance.

Figure 8:
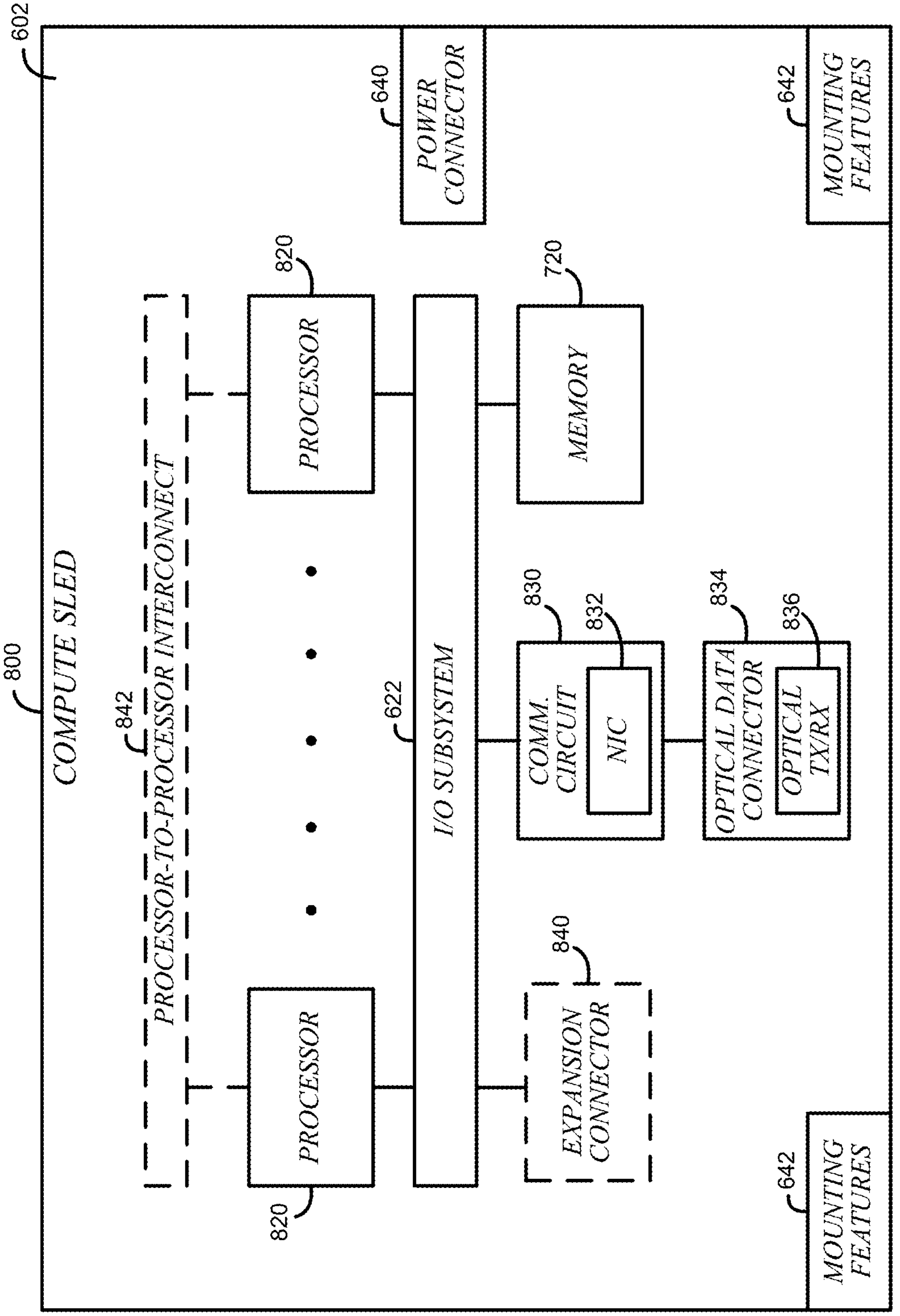
FIG. 8 is a simplified block diagram of at least one embodiment of a compute sled usable in the data center of FIG. 1.

Referring now to FIG. 8, in some embodiments, the sled 400 may be embodied as a compute sled 800. The compute sled 800 is optimized, or otherwise configured, to perform compute tasks. Of course, as discussed above, the compute sled 800 may rely on other sleds, such as acceleration sleds and/or storage sleds, to perform such compute tasks. The compute sled 800 includes various physical resources (e.g., electrical components) similar to the physical resources of the sled 400, which have been identified in FIG. 8 using the same reference numbers. The description of such components provided above in regard to FIGS. 6 and 7 applies to the corresponding components of the compute sled 800 and is not repeated herein for clarity of the description of the compute sled 800.

In the illustrative compute sled 800, the physical resources 620 are embodied as processors 820. Although only two processors 820 are shown in FIG. 8, it should be appreciated that the compute sled 800 may include additional processors 820 in other embodiments. Illustratively, the processors 820 are embodied as high-performance processors 820 and may be configured to operate at a relatively high power rating. Although the processors 820 generate additional heat operating at power ratings greater than typical processors (which operate at around 155-230 W), the enhanced thermal cooling characteristics of the chassis-less circuit board substrate 602 discussed above facilitate the higher power operation. For example, in the illustrative embodiment, the processors 820 are configured to operate at a power rating of at least 250 W. In some embodiments, the processors 820 may be configured to operate at a power rating of at least 350 W.

In some embodiments, the compute sled 800 may also include a processor-to-processor interconnect 842. Similar to the resource-to-resource interconnect 624 of the sled 400 discussed above, the processor-to-processor interconnect 842 may be embodied as any type of communication interconnect capable of facilitating processor-to-processor interconnect 842 communications. In the illustrative embodiment, the processor-to-processor interconnect 842 is embodied as a high-speed point-to-point interconnect (e.g., faster than the I/O subsystem 622). For example, the processor-to-processor interconnect 842 may be embodied as a QuickPath Interconnect (QPI), an UltraPath Interconnect (UPI), or other high-speed point-to-point interconnect dedicated to processor-to-processor communications.

The compute sled 800 also includes a communication circuit 830. The illustrative communication circuit 830 includes a network interface controller (NIC) 832, which may also be referred to as a host fabric interface (HFI). The NIC 832 may be embodied as, or otherwise include, any type of integrated circuit, discrete circuits, controller chips, chipsets, add-in-boards, daughtercards, network interface cards, other devices that may be used by the compute sled 800 to connect with another compute device (e.g., with other sleds 400). In some embodiments, the NIC 832 may be embodied as part of a system-on-a-chip (SoC) that includes one or more processors, or included on a multichip package that also contains one or more processors. In some embodiments, the NIC 832 may include a local processor (not shown) and/or a local memory (not shown) that are both local to the NIC 832. In such embodiments, the local processor of the NIC 832 may be capable of performing one or more of the functions of the processors 820. Additionally or alternatively, in such embodiments, the local memory of the NIC 832 may be integrated into one or more components of the compute sled at the board level, socket level, chip level, and/or other levels.

The communication circuit 830 is communicatively coupled to an optical data connector 834. The optical data connector 834 is configured to mate with a corresponding optical data connector of the rack 240 when the compute sled 800 is mounted in the rack 240. Illustratively, the optical data connector 834 includes a plurality of optical fibers which lead from a mating surface of the optical data connector 834 to an optical transceiver 836. The optical transceiver 836 is configured to convert incoming optical signals from the rack-side optical data connector to electrical signals and to convert electrical signals to outgoing optical signals to the rack-side optical data connector. Although shown as forming part of the optical data connector 834 in the illustrative embodiment, the optical transceiver 836 may form a portion of the communication circuit 830 in other embodiments.

In some embodiments, the compute sled 800 may also include an expansion connector 840. In such embodiments, the expansion connector 840 is configured to mate with a corresponding connector of an expansion chassis-less circuit board substrate to provide additional physical resources to the compute sled 800. The additional physical resources may be used, for example, by the processors 820 during operation of the compute sled 800. The expansion chassis-less circuit board substrate may be substantially similar to the chassis-less circuit board substrate 602 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 9:
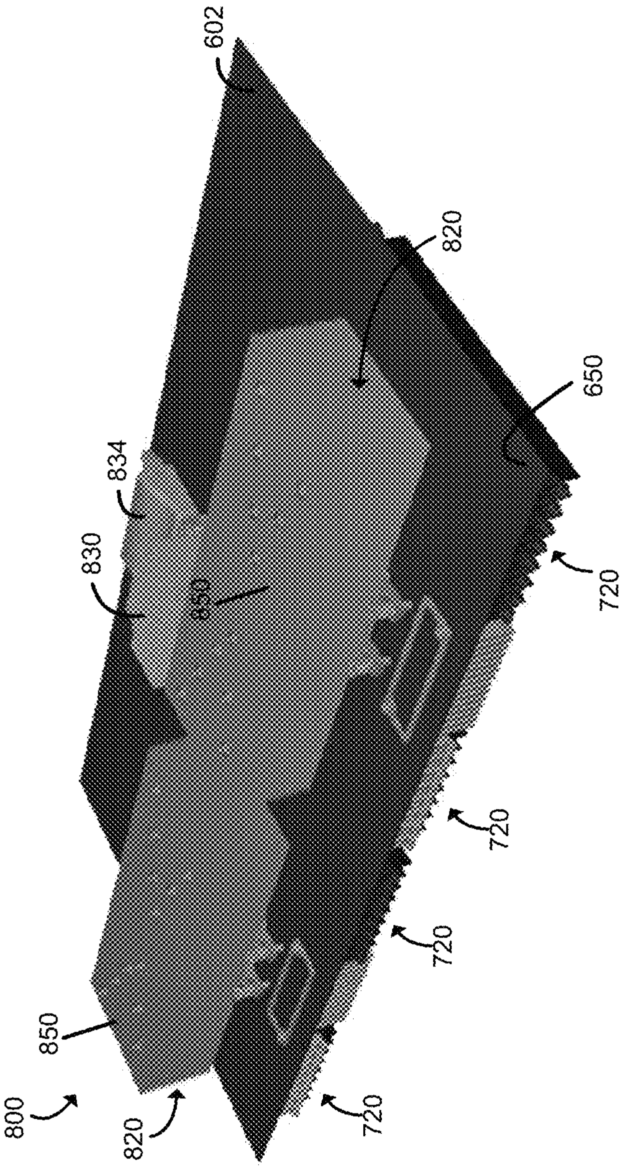
FIG. 9 is a top perspective view of at least one embodiment of the compute sled of FIG. 8.

Referring now to FIG. 9, an illustrative embodiment of the compute sled 800 is shown. As shown, the processors 820, communication circuit 830, and optical data connector 834 are mounted to the top side 650 of the chassis-less circuit board substrate 602. Any suitable attachment or mounting technology may be used to mount the physical resources of the compute sled 800 to the chassis-less circuit board substrate 602. For example, the various physical resources may be mounted in corresponding sockets (e.g., a processor socket), holders, or brackets. In some cases, some of the electrical components may be directly mounted to the chassis-less circuit board substrate 602 via soldering or similar techniques.

As discussed above, the individual processors 820 and communication circuit 830 are mounted to the top side 650 of the chassis-less circuit board substrate 602 such that no two heat-producing, electrical components shadow each other. In the illustrative embodiment, the processors 820 and communication circuit 830 are mounted in corresponding locations on the top side 650 of the chassis-less circuit board substrate 602 such that no two of those physical resources are linearly in-line with others along the direction of the airflow path 608. It should be appreciated that, although the optical data connector 834 is in-line with the communication circuit 830, the optical data connector 834 produces no or nominal heat during operation.

The memory devices 720 of the compute sled 800 are mounted to the bottom side 750 of the of the chassis-less circuit board substrate 602 as discussed above in regard to the sled 400. Although mounted to the bottom side 750, the memory devices 720 are communicatively coupled to the processors 820 located on the top side 650 via the I/O subsystem 622. Because the chassis-less circuit board substrate 602 is embodied as a double-sided circuit board, the memory devices 720 and the processors 820 may be communicatively coupled by one or more vias, connectors, or other mechanisms extending through the chassis-less circuit board substrate 602. Of course, each processor 820 may be communicatively coupled to a different set of one or more memory devices 720 in some embodiments. Alternatively, in other embodiments, each processor 820 may be communicatively coupled to each memory device 720. In some embodiments, the memory devices 720 may be mounted to one or more memory mezzanines on the bottom side of the chassis-less circuit board substrate 602 and may interconnect with a corresponding processor 820 through a ball-grid array.

Each of the processors 820 includes a heatsink 850 secured thereto. Due to the mounting of the memory devices 720 to the bottom side 750 of the chassis-less circuit board substrate 602 (as well as the vertical spacing of the sleds 400 in the corresponding rack 240), the top side 650 of the chassis-less circuit board substrate 602 includes additional "free" area or space that facilitates the use of heatsinks 850 having a larger size relative to traditional heatsinks used in typical servers. Additionally, due to the improved thermal cooling characteristics of the chassis-less circuit board substrate 602, none of the processor heatsinks 850 include cooling fans attached thereto. That is, each of the heatsinks 850 is embodied as a fan-less heatsinks.

Figure 10:
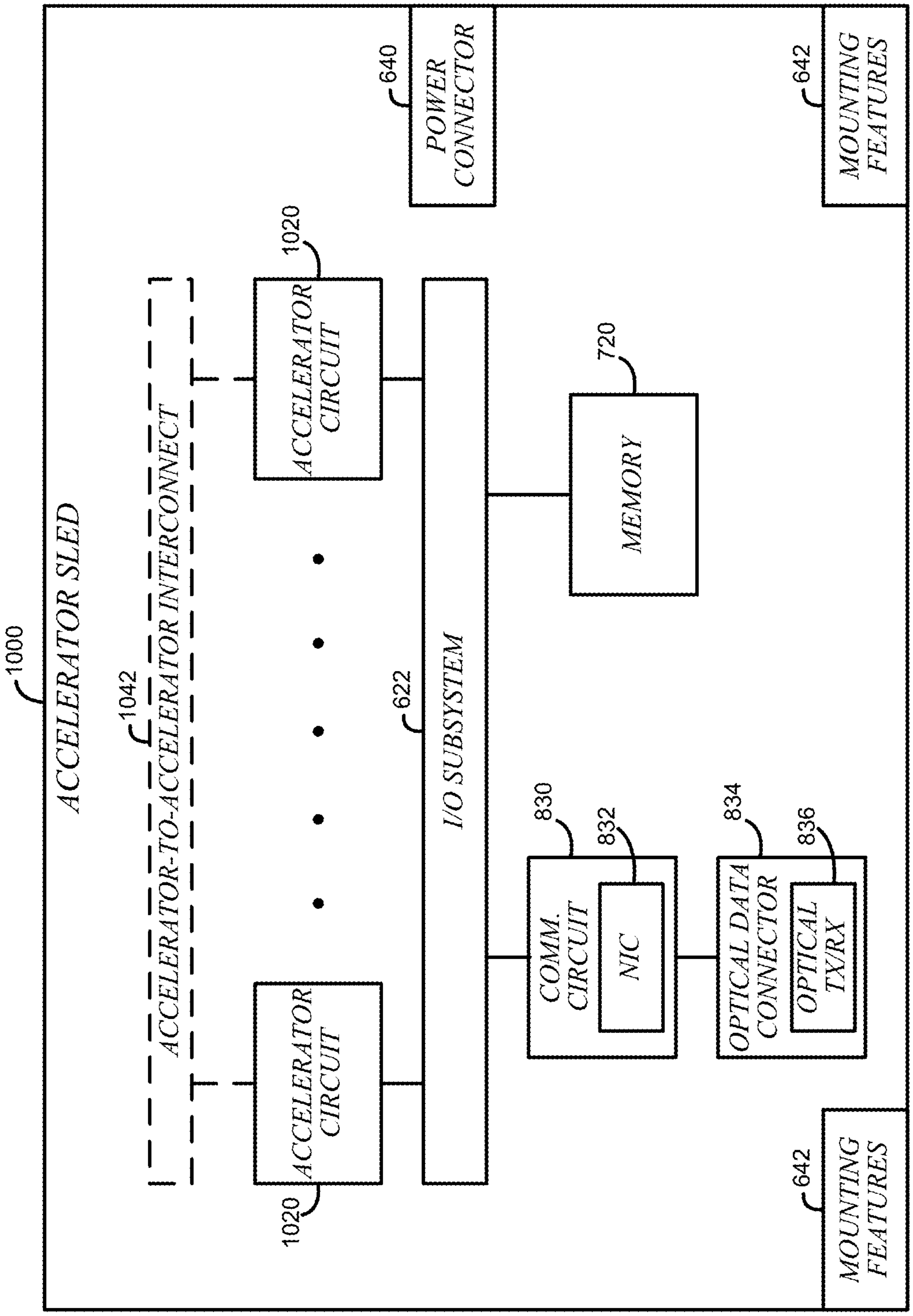
FIG. 10 is a simplified block diagram of at least one embodiment of an accelerator sled usable in the data center of FIG. 1.

Referring now to FIG. 10, in some embodiments, the sled 400 may be embodied as an accelerator sled 1000. The accelerator sled 1000 is optimized, or otherwise configured, to perform specialized compute tasks, such as machine learning, encryption, hashing, or other computational-intensive task. In some embodiments, for example, a compute sled 800 may offload tasks to the accelerator sled 1000 during operation. The accelerator sled 1000 includes various components similar to components of the sled 400 and/or compute sled 800, which have been identified in FIG. 10 using the same reference numbers. The description of such components provided above in regard to FIGS. 6, 7, and 8 apply to the corresponding components of the accelerator sled 1000 and is not repeated herein for clarity of the description of the accelerator sled 1000.

Figure 11:
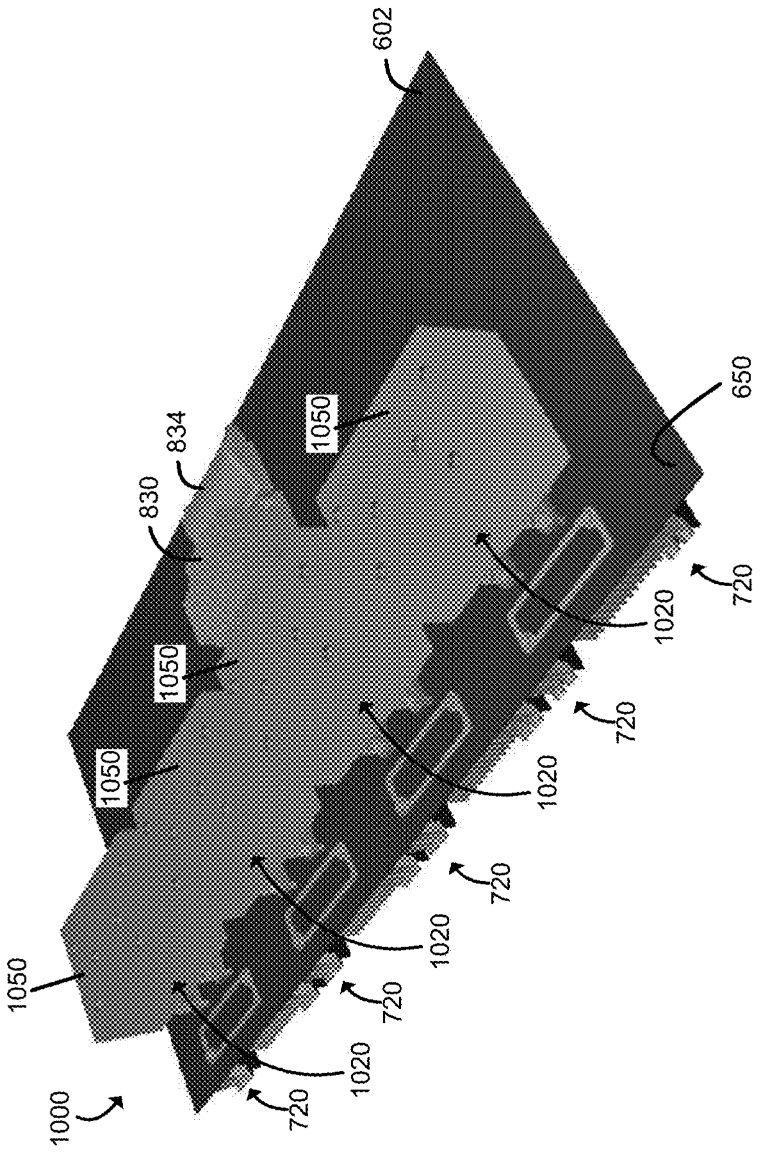
FIG. 11 is a top perspective view of at least one embodiment of the accelerator sled of FIG. 10.

In the illustrative accelerator sled 1000, the physical resources 620 are embodied as accelerator circuits 1020. Although only two accelerator circuits 1020 are shown in FIG. 10, it should be appreciated that the accelerator sled 1000 may include additional accelerator circuits 1020 in other embodiments. For example, as shown in FIG. 11, the accelerator sled 1000 may include four accelerator circuits 1020 in some embodiments. The accelerator circuits 1020 may be embodied as any type of processor, co-processor, compute circuit, or other device capable of performing compute or processing operations. For example, the accelerator circuits 1020 may be embodied as, for example, field programmable gate arrays (FPGA), application-specific integrated circuits (ASICs), security co-processors, graphics processing units (GPUs), machine learning circuits, or other specialized processors, controllers, devices, and/or circuits.

In some embodiments, the accelerator sled 1000 may also include an accelerator-to-accelerator interconnect 1042. Similar to the resource-to-resource interconnect 624 of the sled 600 discussed above, the accelerator-to-accelerator interconnect 1042 may be embodied as any type of communication interconnect capable of facilitating accelerator-to-accelerator communications. In the illustrative embodiment, the accelerator-to-accelerator interconnect 1042 is embodied as a high-speed point-to-point interconnect (e.g., faster than the I/O subsystem 622). For example, the accelerator-to-accelerator interconnect 1042 may be embodied as a QuickPath Interconnect (QPI), an UltraPath Interconnect (UPI), or other high-speed point-to-point interconnect dedicated to processor-to-processor communications. In some embodiments, the accelerator circuits 1020 may be daisy-chained with a primary accelerator circuit 1020 connected to the NIC 832 and memory 720 through the I/O subsystem 622 and a secondary accelerator circuit 1020 connected to the NIC 832 and memory 720 through a primary accelerator circuit 1020.

Referring now to FIG. 11, an illustrative embodiment of the accelerator sled 1000 is shown. As discussed above, the accelerator circuits 1020, communication circuit 830, and optical data connector 834 are mounted to the top side 650 of the chassis-less circuit board substrate 602. Again, the individual accelerator circuits 1020 and communication circuit 830 are mounted to the top side 650 of the chassis-less circuit board substrate 602 such that no two heat-producing, electrical components shadow each other as discussed above. The memory devices 720 of the accelerator sled 1000 are mounted to the bottom side 750 of the of the chassis-less circuit board substrate 602 as discussed above in regard to the sled 600. Although mounted to the bottom side 750, the memory devices 720 are communicatively coupled to the accelerator circuits 1020 located on the top side 650 via the I/O subsystem 622 (e.g., through vias). Further, each of the accelerator circuits 1020 may include a heatsink 1070 that is larger than a traditional heatsink used in a server. As discussed above with reference to the heatsinks 870, the heatsinks 1070 may be larger than tradition heatsinks because of the "free" area provided by the memory devices 750 being located on the bottom side 750 of the chassis-less circuit board substrate 602 rather than on the top side 650.

Figure 12:
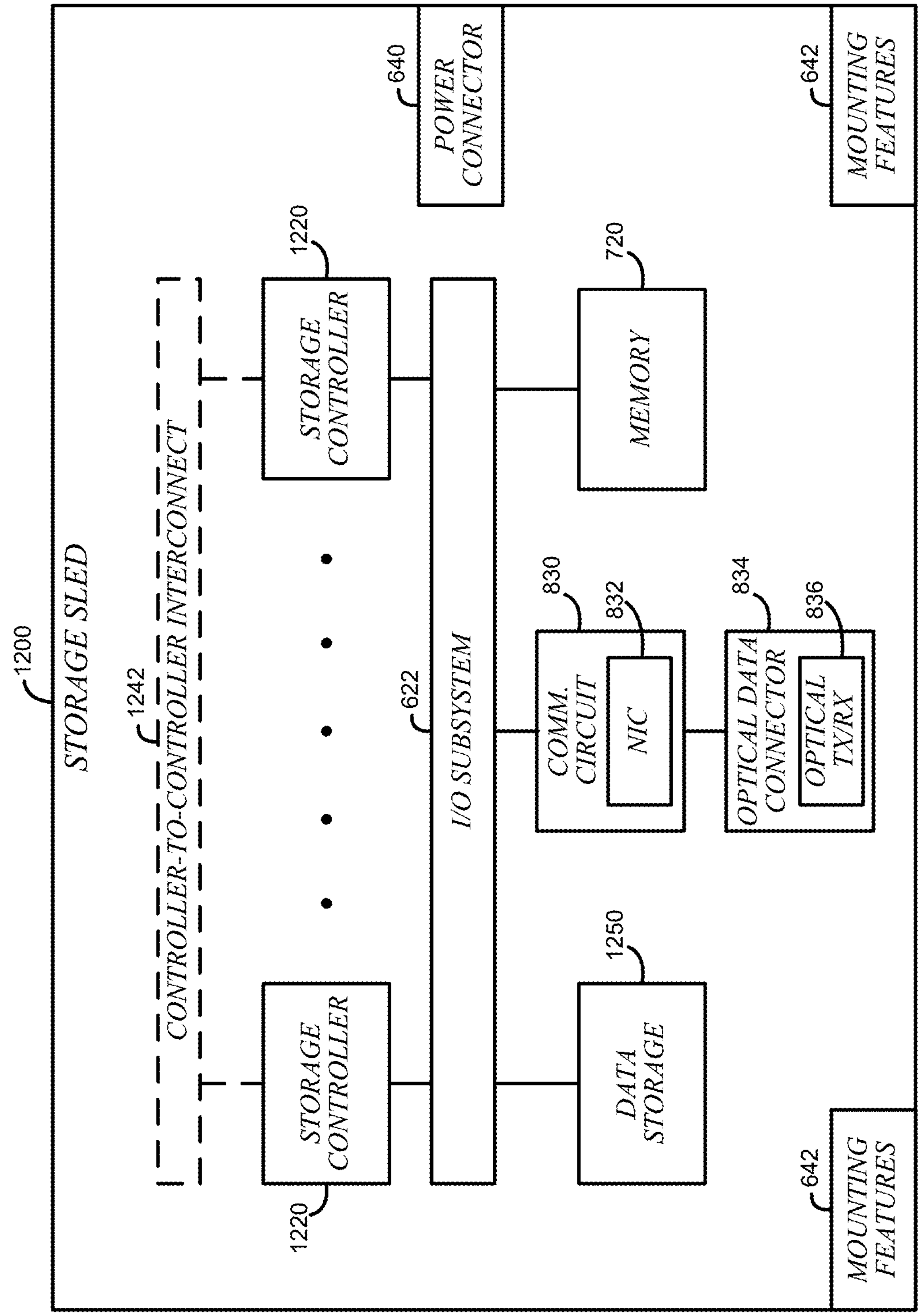
FIG. 12 is a simplified block diagram of at least one embodiment of a storage sled usable in the data center of FIG. 1.

Referring now to FIG. 12, in some embodiments, the sled 400 may be embodied as a storage sled 1200. The storage sled 1200 is optimized, or otherwise configured, to store data in a data storage 1250 local to the storage sled 1200. For example, during operation, a compute sled 800 or an accelerator sled 1000 may store and retrieve data from the data storage 1250 of the storage sled 1200. The storage sled 1200 includes various components similar to components of the sled 400 and/or the compute sled 800, which have been identified in FIG. 12 using the same reference numbers. The description of such components provided above in regard to FIGS. 6, 7, and 8 apply to the corresponding components of the storage sled 1200 and is not repeated herein for clarity of the description of the storage sled 1200.

In the illustrative storage sled 1200, the physical resources 620 are embodied as storage controllers 1220. Although only two storage controllers 1220 are shown in FIG. 12, it should be appreciated that the storage sled 1200 may include additional storage controllers 1220 in other embodiments. The storage controllers 1220 may be embodied as any type of processor, controller, or control circuit capable of controlling the storage and retrieval of data into the data storage 1250 based on requests received via the communication circuit 830. In the illustrative embodiment, the storage controllers 1220 are embodied as relatively low-power processors or controllers. For example, in some embodiments, the storage controllers 1220 may be configured to operate at a power rating of about 75 watts.

In some embodiments, the storage sled 1200 may also include a controller-to-controller interconnect 1242. Similar to the resource-to-resource interconnect 624 of the sled 400 discussed above, the controller-to-controller interconnect 1242 may be embodied as any type of communication interconnect capable of facilitating controller-to-controller communications. In the illustrative embodiment, the controller-to-controller interconnect 1242 is embodied as a high-speed point-to-point interconnect (e.g., faster than the I/O subsystem 622). For example, the controller-to-controller interconnect 1242 may be embodied as a QuickPath Interconnect (QPI), an UltraPath Interconnect (UPI), or other high-speed point-to-point interconnect dedicated to processor-to-processor communications.

Figure 13:
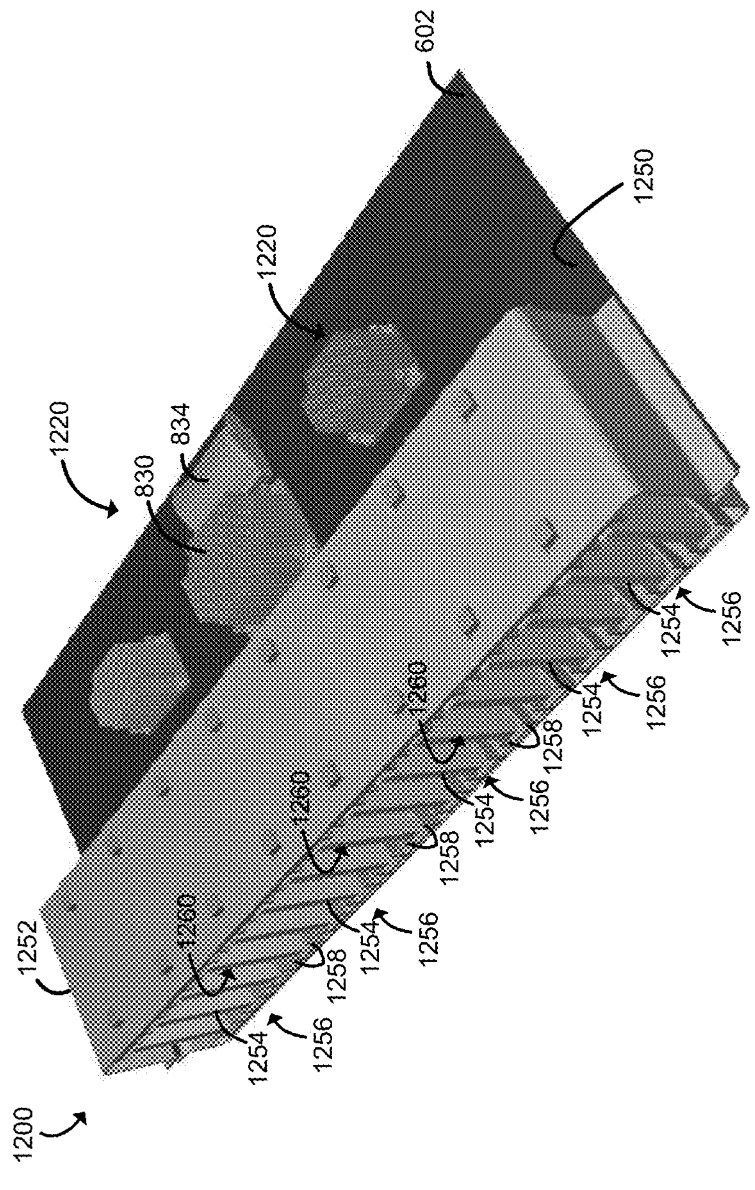
FIG. 13 is a top perspective view of at least one embodiment of the storage sled of FIG. 12.

Referring now to FIG. 13, an illustrative embodiment of the storage sled 1200 is shown. In the illustrative embodiment, the data storage 1250 is embodied as, or otherwise includes, a storage cage 1252 configured to house one or more solid state drives (SSDs) 1254. To do so, the storage cage 1252 includes a number of mounting slots 1256, each of which is configured to receive a corresponding solid state drive 1254. Each of the mounting slots 1256 includes a number of drive guides 1258 that cooperate to define an access opening 1260 of the corresponding mounting slot 1256. The storage cage 1252 is secured to the chassis-less circuit board substrate 602 such that the access openings face away from (i.e., toward the front of) the chassis-less circuit board substrate 602. As such, solid state drives 1254 are accessible while the storage sled 1200 is mounted in a corresponding rack 204. For example, a solid state drive 1254 may be swapped out of a rack 240 (e.g., via a robot) while the storage sled 1200 remains mounted in the corresponding rack 240.

The storage cage 1252 illustratively includes sixteen mounting slots 1256 and is capable of mounting and storing sixteen solid state drives 1254. Of course, the storage cage 1252 may be configured to store additional or fewer solid state drives 1254 in other embodiments. Additionally, in the illustrative embodiment, the solid state drivers are mounted vertically in the storage cage 1252, but may be mounted in the storage cage 1252 in a different orientation in other embodiments. Each solid state drive 1254 may be embodied as any type of data storage device capable of storing long term data. To do so, the solid state drives 1254 may include volatile and non-volatile memory devices discussed above.

As shown in FIG. 13, the storage controllers 1220, the communication circuit 830, and the optical data connector 834 are illustratively mounted to the top side 650 of the chassis-less circuit board substrate 602. Again, as discussed above, any suitable attachment or mounting technology may be used to mount the electrical components of the storage sled 1200 to the chassis-less circuit board substrate 602 including, for example, sockets (e.g., a processor socket), holders, brackets, soldered connections, and/or other mounting or securing techniques.

As discussed above, the individual storage controllers 1220 and the communication circuit 830 are mounted to the top side 650 of the chassis-less circuit board substrate 602 such that no two heat-producing, electrical components shadow each other. For example, the storage controllers 1220 and the communication circuit 830 are mounted in corresponding locations on the top side 650 of the chassis-less circuit board substrate 602 such that no two of those electrical components are linearly in-line with other along the direction of the airflow path 608.

The memory devices 720 of the storage sled 1200 are mounted to the bottom side 750 of the of the chassis-less circuit board substrate 602 as discussed above in regard to the sled 400. Although mounted to the bottom side 750, the memory devices 720 are communicatively coupled to the storage controllers 1220 located on the top side 650 via the I/O subsystem 622. Again, because the chassis-less circuit board substrate 602 is embodied as a double-sided circuit board, the memory devices 720 and the storage controllers 1220 may be communicatively coupled by one or more vias, connectors, or other mechanisms extending through the chassis-less circuit board substrate 602. Each of the storage controllers 1220 includes a heatsink 1270 secured thereto. As discussed above, due to the improved thermal cooling characteristics of the chassis-less circuit board substrate 602 of the storage sled 1200, none of the heatsinks 1270 include cooling fans attached thereto. That is, each of the heatsinks 1270 is embodied as a fan-less heatsink.

Figure 14:
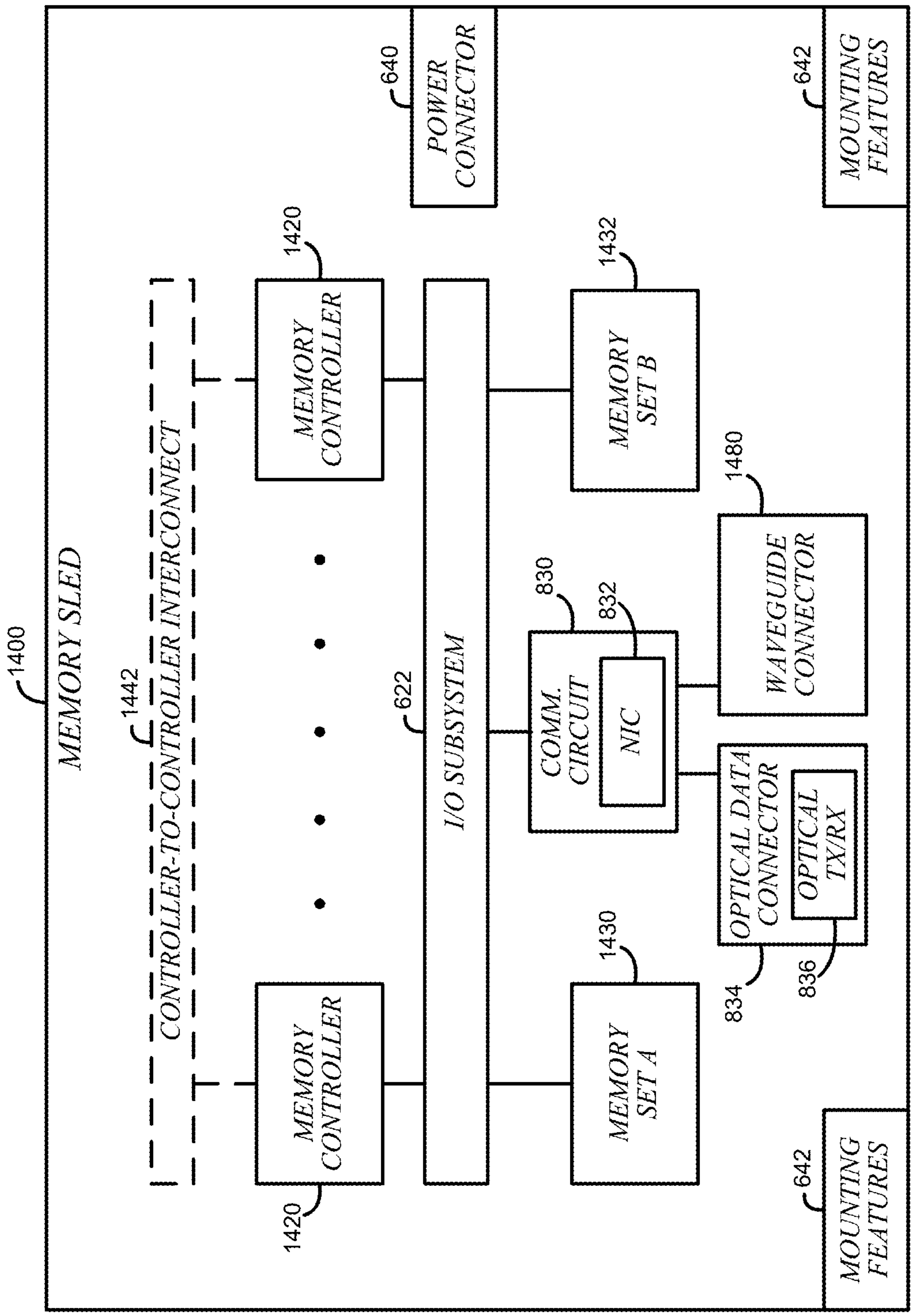
FIG. 14 is a simplified block diagram of at least one embodiment of a memory sled usable in the data center of FIG. 1.

Referring now to FIG. 14, in some embodiments, the sled 400 may be embodied as a memory sled 1400. The storage sled 1400 is optimized, or otherwise configured, to provide other sleds 400 (e.g., compute sleds 800, accelerator sleds 1000, etc.) with access to a pool of memory (e.g., in two or more sets 1430, 1432 of memory devices 720) local to the memory sled 1200. For example, during operation, a compute sled 800 or an accelerator sled 1000 may remotely write to and/or read from one or more of the memory sets 1430, 1432 of the memory sled 1200 using a logical address space that maps to physical addresses in the memory sets 1430, 1432. The memory sled 1400 includes various components similar to components of the sled 400 and/or the compute sled 800, which have been identified in FIG. 14 using the same reference numbers. The description of such components provided above in regard to FIGS. 6, 7, and 8 apply to the corresponding components of the memory sled 1400 and is not repeated herein for clarity of the description of the memory sled 1400.

In the illustrative memory sled 1400, the physical resources 620 are embodied as memory controllers 1420. Although only two memory controllers 1420 are shown in FIG. 14, it should be appreciated that the memory sled 1400 may include additional memory controllers 1420 in other embodiments. The memory controllers 1420 may be embodied as any type of processor, controller, or control circuit capable of controlling the writing and reading of data into the memory sets 1430, 1432 based on requests received via the communication circuit 830. In the illustrative embodiment, each storage controller 1220 is connected to a corresponding memory set 1430, 1432 to write to and read from memory devices 720 within the corresponding memory set 1430, 1432 and enforce any permissions (e.g., read, write, etc.) associated with sled 400 that has sent a request to the memory sled 1400 to perform a memory access operation (e.g., read or write).

In some embodiments, the memory sled 1400 may also include a controller-to-controller interconnect 1442. Similar to the resource-to-resource interconnect 624 of the sled 400 discussed above, the controller-to-controller interconnect 1442 may be embodied as any type of communication interconnect capable of facilitating controller-to-controller communications. In the illustrative embodiment, the controller-to-controller interconnect 1442 is embodied as a high-speed point-to-point interconnect (e.g., faster than the I/O subsystem 622). For example, the controller-to-controller interconnect 1442 may be embodied as a QuickPath Interconnect (QPI), an UltraPath Interconnect (UPI), or other high-speed point-to-point interconnect dedicated to processor-to-processor communications. As such, in some embodiments, a memory controller 1420 may access, through the controller-to-controller interconnect 1442, memory that is within the memory set 1432 associated with another memory controller 1420. In some embodiments, a scalable memory controller is made of multiple smaller memory controllers, referred to herein as "chiplets", on a memory sled (e.g., the memory sled 1400). The chiplets may be interconnected (e.g., using EMIB (Embedded Multi-Die Interconnect Bridge)). The combined chiplet memory controller may scale up to a relatively large number of memory controllers and I/O ports, (e.g., up to 16 memory channels). In some embodiments, the memory controllers 1420 may implement a memory interleave (e.g., one memory address is mapped to the memory set 1430, the next memory address is mapped to the memory set 1432, and the third address is mapped to the memory set 1430, etc.). The interleaving may be managed within the memory controllers 1420, or from CPU sockets (e.g., of the compute sled 800) across network links to the memory sets 1430, 1432, and may improve the latency associated with performing memory access operations as compared to accessing contiguous memory addresses from the same memory device.

Further, in some embodiments, the memory sled 1400 may be connected to one or more other sleds 400 (e.g., in the same rack 240 or an adjacent rack 240) through a waveguide, using the waveguide connector 1480. In the illustrative embodiment, the waveguides are 64 millimeter waveguides that provide 16 Rx (i.e., receive) lanes and 16 Rt (i.e., transmit) lanes. Each lane, in the illustrative embodiment, is either 16 Ghz or 32 Ghz. In other embodiments, the frequencies may be different. Using a waveguide may provide high throughput access to the memory pool (e.g., the memory sets 1430, 1432) to another sled (e.g., a sled 400 in the same rack 240 or an adjacent rack 240 as the memory sled 1400) without adding to the load on the optical data connector 834.

Figure 15:
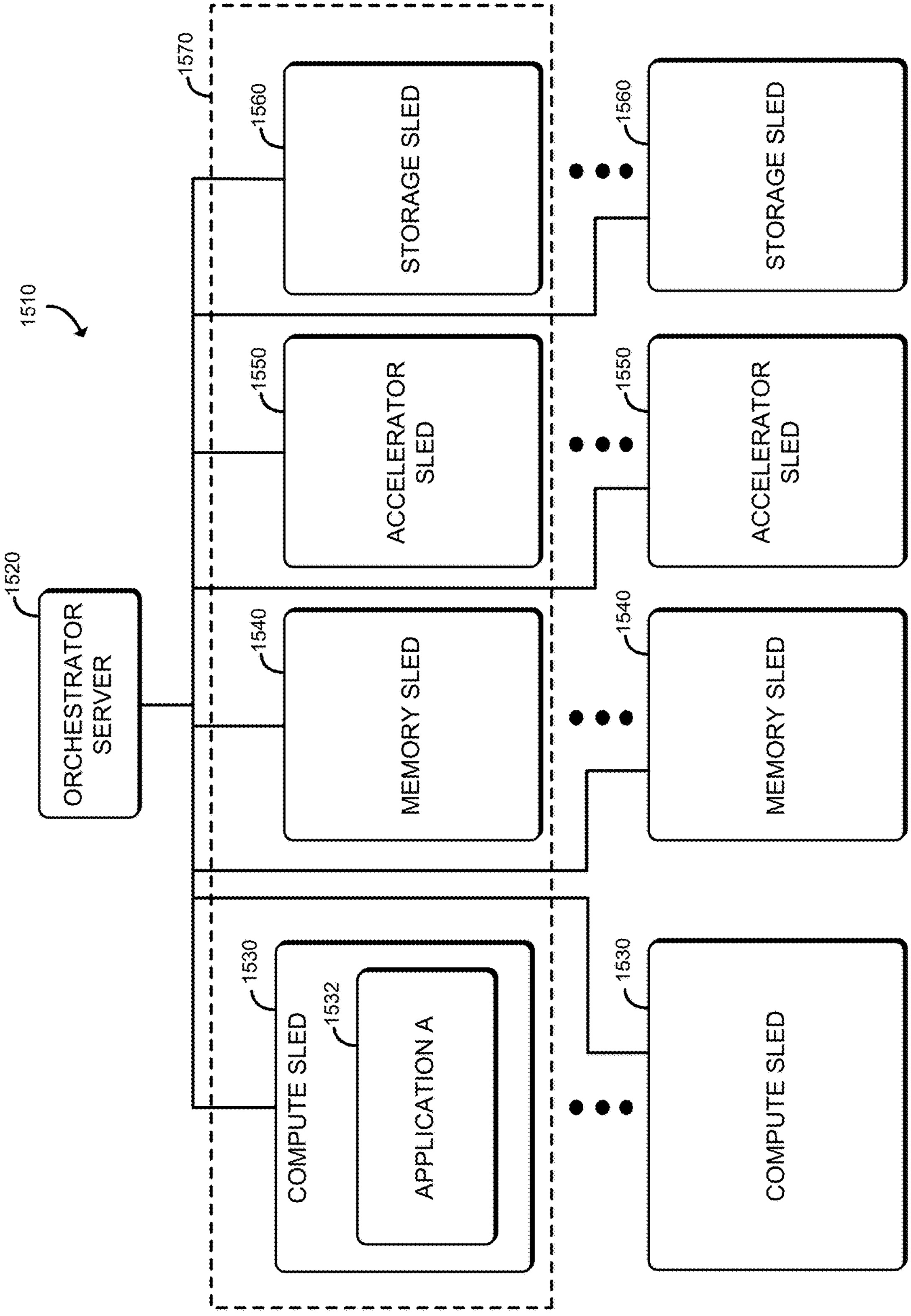
FIG. 15 is a simplified block diagram of a system that may be established within the data center of FIG. 1 to execute workloads with managed nodes composed of disaggregated resources.

Referring now to FIG. 15, a system for executing one or more workloads (e.g., applications) may be implemented in accordance with the data center 100. In the illustrative embodiment, the system 1510 includes an orchestrator server 1520, which may be embodied as a managed node comprising a compute device (e.g., a compute sled 800) executing management software (e.g., a cloud operating environment, such as OpenStack) that is communicatively coupled to multiple sleds 400 including a large number of compute sleds 1530 (e.g., each similar to the compute sled 800), memory sleds 1540 (e.g., each similar to the memory sled 1400), accelerator sleds 1550 (e.g., each similar to the memory sled 1000), and storage sleds 1560 (e.g., each similar to the storage sled 1200). One or more of the sleds 1530, 1540, 1550, 1560 may be grouped into a managed node 1570, such as by the orchestrator server 1520, to collectively perform a workload (e.g., an application 1232 executed in a virtual machine or in a container). The managed node 1570 may be embodied as an assembly of physical resources 620, such as processors 820, memory resources 720, accelerator circuits 1020, or data storage 1250, from the same or different sleds 400. Further, the managed node may be established, defined, or "spun up" by the orchestrator server 1520 at the time a workload is to be assigned to the managed node or at any other time, and may exist regardless of whether any workloads are presently assigned to the managed node. In the illustrative embodiment, the orchestrator server 1520 may selectively allocate and/or deallocate physical resources 620 from the sleds 400 and/or add or remove one or more sleds 400 from the managed node 1570 as a function of quality of service (QoS) targets (e.g., performance targets associated with a throughput, latency, instructions per second, etc.) associated with a service level agreement for the workload (e.g., the application 1532). In doing so, the orchestrator server 1520 may receive telemetry data indicative of performance conditions (e.g., throughput, latency, instructions per second, etc.) in each sled 400 of the managed node 1570 and compare the telemetry data to the quality of service targets to determine whether the quality of service targets are being satisfied. If the so, the orchestrator server 1520 may additionally determine whether one or more physical resources may be deallocated from the managed node 1570 while still satisfying the QoS targets, thereby freeing up those physical resources for use in another managed node (e.g., to execute a different workload). Alternatively, if the QoS targets are not presently satisfied, the orchestrator server 1520 may determine to dynamically allocate additional physical resources to assist in the execution of the workload (e.g., the application 1532) while the workload is executing Additionally, in some embodiments, the orchestrator server 1520 may identify trends in the resource utilization of the workload (e.g., the application 1532), such as by identifying phases of execution (e.g., time periods in which different operations, each having different resource utilizations characteristics, are performed) of the workload (e.g., the application 1532) and pre-emptively identifying available resources in the data center 100 and allocating them to the managed node 1570 (e.g., within a predefined time period of the associated phase beginning). In some embodiments, the orchestrator server 1520 may model performance based on various latencies and a distribution scheme to place workloads among compute sleds and other resources (e.g., accelerator sleds, memory sleds, storage sleds) in the data center 100. For example, the orchestrator server 1520 may utilize a model that accounts for the performance of resources on the sleds 400 (e.g., FPGA performance, memory access latency, etc.) and the performance (e.g., congestion, latency, bandwidth) of the path through the network to the resource (e.g., FPGA). As such, the orchestrator server 1520 may determine which resource(s) should be used with which workloads based on the total latency associated with each potential resource available in the data center 100 (e.g., the latency associated with the performance of the resource itself in addition to the latency associated with the path through the network between the compute sled executing the workload and the sled 400 on which the resource is located).

In some embodiments, the orchestrator server 1520 may generate a map of heat generation in the data center 100 using telemetry data (e.g., temperatures, fan speeds, etc.) reported from the sleds 400 and allocate resources to managed nodes as a function of the map of heat generation and predicted heat generation associated with different workloads, to maintain a target temperature and heat distribution in the data center 100. Additionally or alternatively, in some embodiments, the orchestrator server 1520 may organize received telemetry data into a hierarchical model that is indicative of a relationship between the managed nodes (e.g., a spatial relationship such as the physical locations of the resources of the managed nodes within the data center 100 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1520 may determine the differences based on the telemetry data stored in the hierarchical model and factor the differences into a prediction of future resource utilization of a workload if the workload is reassigned from one managed node to another managed node, to accurately balance resource utilization in the data center 100.

To reduce the computational load on the orchestrator server 1520 and the data transfer load on the network, in some embodiments, the orchestrator server 1520 may send self-test information to the sleds 400 to enable each sled 400 to locally (e.g., on the sled 400) determine whether telemetry data generated by the sled 400 satisfies one or more conditions (e.g., an available capacity that satisfies a predefined threshold, a temperature that satisfies a predefined threshold, etc.). Each sled 400 may then report back a simplified result (e.g., yes or no) to the orchestrator server 1520, which the orchestrator server 1520 may utilize in determining the allocation of resources to managed nodes.

Figure 16:
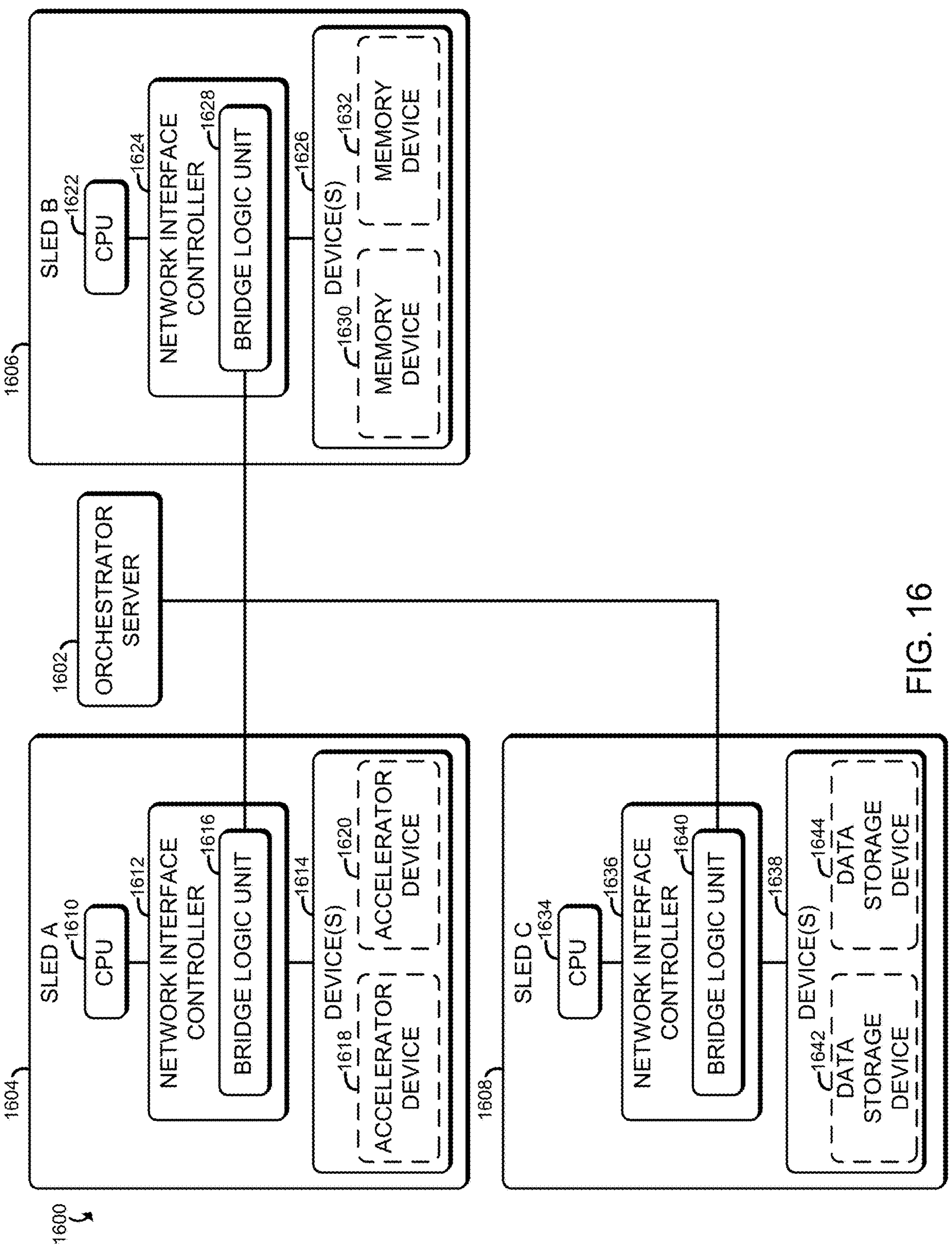
FIG. 16 is a simplified block diagram of at least one embodiment of a system for providing efficient pooling in a hyper converged infrastructure.

Referring now to FIG. 16, a system 1600 for pooling in a hyper converged infrastructure may be implemented in accordance with data center 100, described above with reference to FIG. 1. In the illustrative embodiment, the system 1600 includes an orchestrator server 1602 in communication with a sled A 1604, a sled B 1606, and a sled C 1608. Although only sleds A-C 1604, 1606, 1608 are shown, there may be any number of sleds utilized in the system 1600. The sleds may be embodied as a compute sled, an accelerator sled, a memory sled, and/or data storage sled. One or more of the sleds 1604, 1606, 1608 may be grouped into a managed node, such as by the orchestrator server 1602, to collectively perform a workload, such as an application. A managed node may be embodied as an assembly of resources, such as compute resources, memory resources, storage resources, or other resources, from the same or different sleds or racks. Further, a managed node may be established, defined, or "spun up" by the orchestrator server 1602 at the time a workload is to be assigned to the managed node or at any other time, and may exist regardless of whether any workloads are presently assigned to the managed node. The system 1600 may be located in a data center and provide storage and compute services (e.g., cloud services) to a client device (not shown) that is in communication with the system 1600 through a network (not shown). The orchestrator server 1602 may support a cloud operating environment, such as OpenStack, and managed nodes established by the orchestrator server 1602 may execute one or more applications or processes (i.e., workloads), such as in virtual machines or containers, on behalf of a user of the client device. In the illustrative embodiment, the sled A 1604 utilizes a bridge logic unit 1616, which may be embodied as any device or circuitry capable of routing access requests according to a device map, of a network interface controller (NIC) 1610 to communicate with the orchestrator server 1602 and the other sleds 1606, 1608. In addition, sleds 1606, 1608 includes bridge logic units 1628, 1640 of NICs 1624, 1636 to similarly communicate with the orchestrator server

1602 and the other sleds. Further, in the illustrative embodiment, the sled A 1604 includes a central processing unit (CPU) 1610 to execute workload (e.g., an application), and device(s) 1614 that may include two accelerator devices 1618, 1620. Each of the sleds 1604, 1606, 1608 are similarly embodied and may include a plurality of device(s) 1614, 1626, 1638. The plurality of device(s) 1614, 1626, 1638 may include any combination of accelerator devices 1618, 1620, memory devices 1630, 1632, and data storage devices 1642, 1644.

The sleds 1604, 1606, 1608, in the illustrative embodiment, form a pool of devices to be utilized by other sleds in the network. The bridge logic units 1616, 1628, 1640, in operation, obtain a request to access a device from a requestor device. The requestor device may be embodied as CPU 1610, for example, while CPU 1610 is running a workload. Although described in the context of sled A 1604 and its components, each of the sleds 1604, 1606, 1608 may similarly perform the functions described below. The CPU 1610 executing the workload may require resources to process the workload and as such, may send a request to the bridge logic unit 1616 to access a device. The bridge logic unit 1616 may use a device map received from either the orchestrator server 1602 (e.g., generated by the orchestrator server 1602 from querying the sleds to identify the available devices, input by a human administrator, etc.) or another compute device (not shown), or other sleds 1606, 1608 indicative of the locations of a plurality of devices 1614, 1626, 1638 coupled to the bridge logic units 1616, 1628, 1640. As such, the access requests obtained by the bridge logic unit 1616 (e.g., generated by CPU 1610 while executing a workload) are analyzed by the bridge logic unit 1616, using the device map, to determine which of the sleds 1604, 1606, 1608 has the requested device. For example, in the illustrative embodiment, the bridge logic unit 1616 may determine sled B 1606 includes a plurality of memory devices 1630, 1632 and request to access the memory device 1630. To do so, the bridge logic unit 1616 may communicate with the bridge logic unit 1628, which is selectively powered on, to request the bridge logic unit 1628 to provide access to the memory device 1630. In providing access to the memory device 1630, the bridge logic unit 1628, in the illustrative embodiment, selectively powers on the memory device 1630, leaving other devices, such as the CPU 1622, powered off, to reduce energy consumption. In addition, the requested device (e.g., memory device 1630) may be mapped as local to the sled A 1604 after the memory device 1630 has been powered on. In some embodiments, the bridge logic unit 1616 may also selectively power on devices local to (e.g., onboard) the sled A 1604 (e.g. accelerator devices 1618, 1620, in response to requests from the CPU 1610 and/or other sleds, such as the sleds 1606, 1608 through their respective bridge logic units 1628, 1640). The bridge logic unit 1616 may enable an operating system independent driver to communicate with the requested device, such as a non-volatile memory express driver or a non-volatile memory express over fabric driver. By selectively powering on devices on the sleds on an as-requested basis, rather than keeping all devices on all sleds powered on, the system 1600 reduces the amount of energy consumed by the sleds 1604, 1606, 1608 while still providing access to the resources needed to execute workloads.

Figure 17:
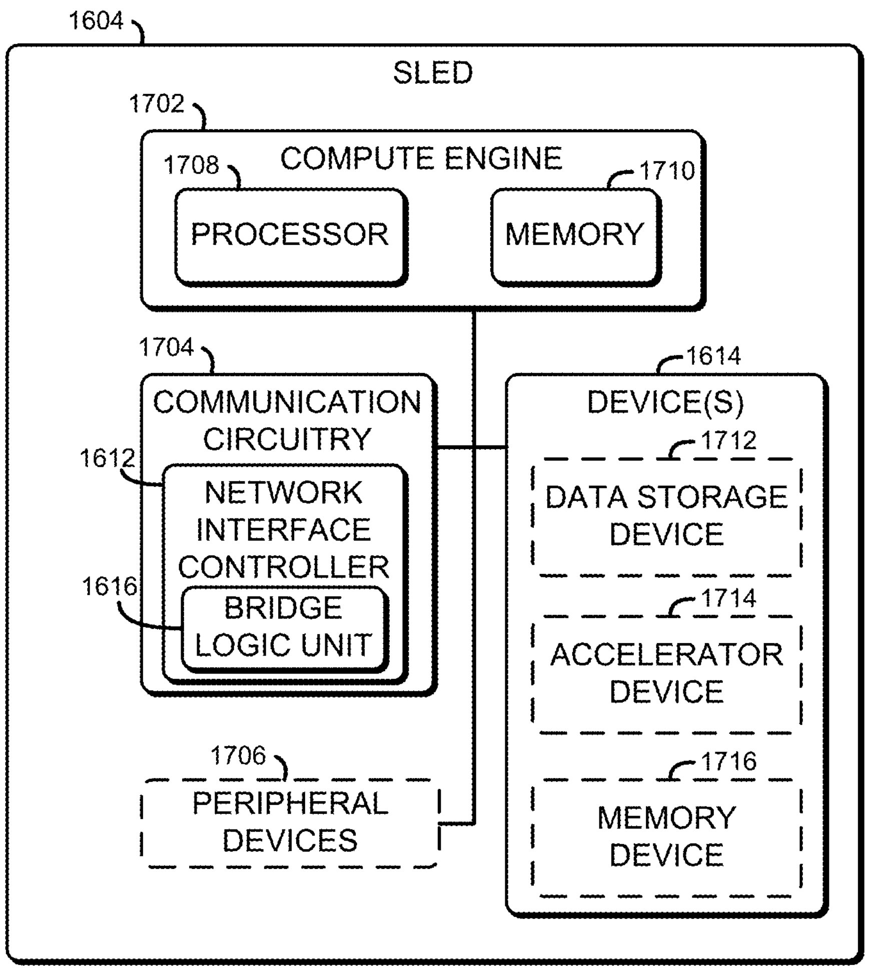
FIG. 17 is a simplified block diagram of at least one embodiment of a sled of the system of FIG. 16.

Referring now to FIG. 17, the sled 1604 may be embodied as any type of compute device capable of performing the functions described herein, including executing one or more workloads and accessing a pool of devices. As shown in FIG. 17, the illustrative sled 1604 includes a compute engine 1702, communication circuitry 1704, and device(s) 1614. In some embodiments, the sled 1604 may include peripheral devices 1706. Of course, in other embodiments, the sled 1604 may include other or additional components, such as those commonly found in a sled. Additionally, in some embodiments, one or more of the illustrative components may be incorporated in, or otherwise form a portion of, another component.

The compute engine 1702 may be embodied as any type of device or collection of devices capable of performing various compute functions described below. In some embodiments, the compute engine 1702 may be embodied as a single device such as an integrated circuit, an embedded system, a field-programmable gate array (FPGA), a system-on-a-chip (SOC), or other integrated system or device. Additionally, in some embodiments, the compute engine 1702 includes or is embodied as a processor 1708 and memory 1710. The processor 1708 may be embodied as any type of processor capable of performing the functions described herein. For example, the processor 1708 may be embodied as a single or multi-core processor, a microcontroller, or other processor or processing/controlling circuit. In some embodiments, the processor 1708 may be embodied as, include, or be coupled to a field-programmable gate array (FPGA), an application specific integrated circuit (ASIC), reconfigurable hardware or hardware circuitry, or other specialized hardware to facilitate performance of the functions described herein.

The memory 1710 may be embodied as any type of volatile (e.g., dynamic random access memory (DRAM), etc.) or non-volatile memory or data storage capable of performing the functions described herein. In addition, the other memory devices 1630, 1632 of FIG. 16 may be embodied similarly to the memory 1710. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

In some embodiments, 3D crosspoint memory may comprise a transistor-less stackable cross point architecture in which memory cells sit at the intersection of word lines and bit lines and are individually addressable and in which bit storage is based on a change in bulk resistance. In operation, the memory 1710 may store various software and data used during operation such as device map data, applications, programs, libraries, and drivers.

The communication circuitry 1704 may be embodied as any communication circuit, device, or collection thereof, capable of enabling communications over a network between the compute devices (e.g., the orchestrator server 1602, and/or one or more sleds 1604, 1606, 1608). The communication circuitry 1704 may be configured to use any one or more communication technology (e.g., wired or wireless communications) and associated protocols (e.g., Ethernet, Bluetooth®, Wi-Fi®, WiMAX, etc.) to effect such communication. In the illustrative embodiment, the communication circuitry 1704 may include the network interface controller (NIC) 1612 (also referred to as a host fabric interface (HFI)), which may similarly be embodied as any communication circuit, device, or collection thereof, capable of enabling communications over a network between the compute devices (e.g., the orchestrator server 1602, and/or one or more sleds 1604, 1606, 1608). In the illustrative embodiment, the NIC 1612 includes a bridge logic unit 1616, which may be embodied as any type of compute device capable of performing the functions described herein. For example, the bridge logic unit 1616 may be embodied as, include, or be coupled to a field-programmable gate array (FPGA), an application specific integrated circuit (ASIC), reconfigurable hardware or hardware circuitry, or other specialized hardware to facilitate performance of the functions described herein. The bridge logic unit 1616 may be configured to communicate with the orchestrator server 1602, sleds 1604, 1606, 1608, or a compute device (not shown) to receive a mapping of the devices and/or establish the mapping of the devices in conjunction with the orchestrator server 1602 and the sleds 1604, 1606, 1608.

As mentioned above, in some embodiments, the sled 1604 may include one or more peripheral devices 1706. Such peripheral devices 1706 may include any type of peripheral device commonly found in a compute device such as a display, speakers, a mouse, a keyboard, and/or other input/output devices, interface devices, and/or other peripheral devices.

The orchestrator server 1602 and the sleds 1606, 1608 may have components similar to those described in FIG. 17. The description of those components of the sled 1604 is equally applicable to the description of components of the orchestrator server 1602 and the sleds 1606, 1608 and is not repeated herein for clarity of the description. Further, it should be appreciated that the orchestrator server 1602 and the sleds 1606, 1608 may include other components, sub-components, and devices commonly found in a computing device, which are not discussed above in reference to the sled 1604 and not discussed herein for clarity of the description.

As described above, the orchestrator server 1602, and the sleds 1604, 1606, 1608 are illustratively in communication via a network (not shown), which may be embodied as any type of wired or wireless communication network, including global networks (e.g., the Internet), local area networks (LANs) or wide area networks (WANs), cellular networks (e.g., Global System for Mobile Communications (GSM), 3G, Long Term Evolution (LTE), Worldwide Interoperability for Microwave Access (WiMAX), etc.), digital subscriber line (DSL) networks, cable networks (e.g., coaxial networks, fiber networks, etc.), or any combination thereof.

Figure 18:
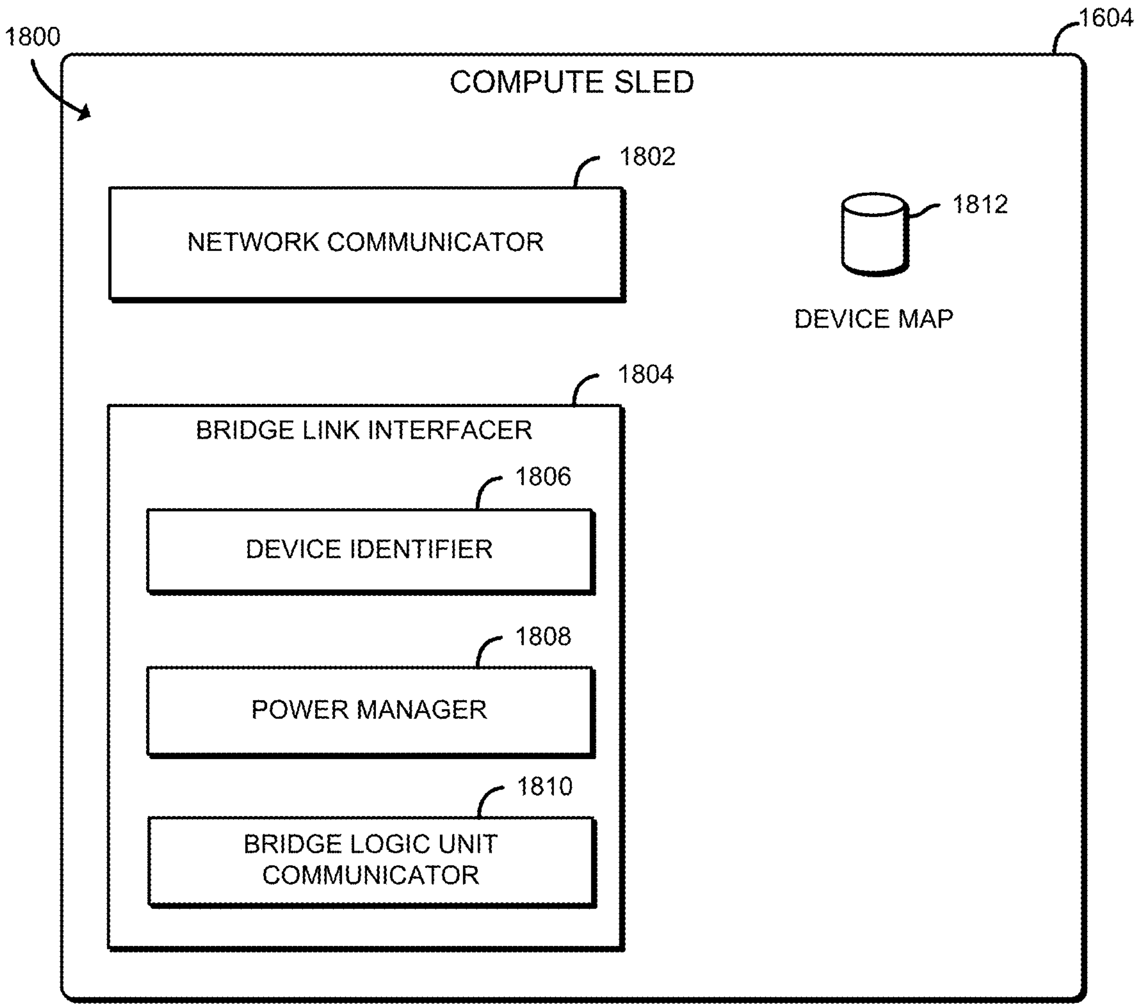
FIG. 18 is a simplified block diagram of at least one embodiment of an environment that may be established by the sled of FIGS. 16 and 17.

Referring now to FIG. 18, the sled 1604 may establish an environment 1800 during operation. The illustrative environment 1800 includes a network communicator 1802 and a bridge link interfacer 1804. Each of the components of the environment 1800 may be embodied as hardware, firmware, software, or a combination thereof. As such, in some embodiments, one or more of the components of the environment 1800 may be embodied as circuitry or a collection of electrical devices (e.g., network communicator circuitry 1802, bridge link interfacer circuitry 1804, etc.). It should be appreciated that, in such embodiments, one or more of the network communicator circuitry 1802 or the bridge link interfacer circuitry 1804 may form a portion of one or more of the compute engine 1702, the communication circuitry 1704, and/or any other components of the sled 1604. In the illustrative embodiment, the environment 1800 includes device map data 1812, which may be embodied as any data established by the orchestrator server 1602, sleds 1604, 1606, 1608, and/or any other compute devices during the execution of one or more workloads by the sleds 1604, 1606, 1608 and is indicative of the location of the devices 1614, 1626, 1638. For example, the device map 1812 may indicate which bridge logic unit 1616, 1628, 1640 the devices 1614, 1626, 1638 are connected to and which sleds 1604, 1606, 1608 the devices 1614, 1626, 1638 located on. As such, the device map data 1812, in the illustrative embodiment, includes information usable to determine whether a requestor device, such as the CPU 1610, is located on the same sled as the requested device (e.g., an accelerator device 1618).

In the illustrative environment 1800, the network communicator 1802, which may be embodied as hardware, firmware, software, virtualized hardware, emulated architecture, and/or a combination thereof as discussed above, is configured to facilitate inbound and outbound network communications (e.g., network traffic, network packets, network flows, etc.) to and from the sled 1604, respectively. To do so, the network communicator 1802 is configured to receive and process data packets from one system or computing device (e.g., a sleds 1606 or 1608, and/or an orchestrator server 1602) and to prepare and send data packets to another computing device or system (e.g., a sleds 1606 or 1608, and/or an orchestrator server 1602). Accordingly, in some embodiments, at least a portion of the functionality of the network communicator 1802 may be performed by the communication circuitry 1704, and, in the illustrative embodiment, by the bridge logic unit 1616 of the NIC 1612. In some embodiments, the network communicator 1802 may communicate with the orchestrator server 1602, sleds 1604, 1606, 1608 and/or a compute device (not shown) to receive a device map data 1812.

The bridge link interfacer 1804, which may be embodied as hardware, firmware, software, virtualized hardware, emulated architecture, and/or a combination thereof, is configured to determine a location of a requested device and which bridge logic unit 1616, 1628, 1640 the requested device is communicatively coupled to. The requested device may be embodied as any of the device(s) 1614, 1626, 1638 that a workload executed on any of the CPUs 1610, 1622, 1634 requests to assist in processing the workload. In addition, the bridge link interfacer 1804 may be configured to selectively power on the requested device and provide access to the requested device to the requestor device. To do so, in the illustrative embodiment, the bridge link interfacer 1804 includes a device identifier 1806, a power manager 1808, and a bridge logic unit communicator 1810. The device identifier 1806, in the illustrative embodiment, is configured to obtain requests (e.g., generated by the CPUs 1610, 1622, 1634 and/or any other device capable of generating requests to access device(s) 1614, 1626, 1638) to access device(s) 1614, 1626, 1638 and service the requests (e.g., facilitate reading and/or writing to device(s) 1614, 1626, 1638 specified in access request). The device identifier 1806, in the illustrative embodiment, is configured to use the device map data 1812 to determine a location of a requested device by identifying what device(s) 1614, 1626, 1638 the requestor device (e.g., CPU 1610, 1622, 1634) requests access to by determining which sled 1604, 1606, 1608 the requested device is located on. The determination of the location may also include determining which bridge logic unit 1616, 1628, 1640 the device(s) 1614, 1626, 1638 is coupled to. In some embodiments, the device identifier 1806 may be configured to update the device map data 1812 in response to receiving a notification from a host, the orchestrator server 1602, and/or the sleds 1604, 1606, 1608. This may occur, for example, when any devices are added to or removed from the system 1600.

The power manager 1808, in the illustrative embodiment, is configured to selectively power on device(s) 1614, 1626, 1634 by requesting the bridge logic unit 1616, 1628, 1640 associated with the device(s) 1614, 1626, 1634 to power on the requested device(s) 1614, 1626, 1634 and leave other device(s) 1614, 1626, 1634 powered off. In doing so, the power manager 1808 may request a bridge logic unit 1616, 1628, 1640 to power on a requested device(s) 1614, 1626, 1634 and leave the CPU 1610, 1622, 1634 of the corresponding sled 1604, 1606, 1608 powered off to conserve energy.

The bridge logic unit communicator 1810, in the illustrative embodiment, is configured to communicate with another bridge logic unit 1628, 1640 to access the requested device on the corresponding sled 1606, 1608. The bridge logic unit communicator 1810 may use the power manager 1808 to request the bridge logic unit 1628, 1640 to selectively power on a requested device located on the associated sled 1606, 1608. The bridge logic unit communicator 1810 may proceed to map the requested device (that may be located on a separate sled 1604, 1606, 1608) as local to the sled 1604, 1606, 1608 that includes the requestor device. In some embodiments, the bridge logic unit communicator 1810 may be configured to receive requests to a access device (e.g., an accelerator device 1614) that is local to (e.g., located on) the sled (e.g., the sled 1604) where the bridge logic unit 1616 is located. The bridge logic unit communicator 1810 may be configured to enable an operating system independent driver to communicate with the requested device(s) 1614, 1626, 1634. In some embodiments, the operating system independent driver may be embodied as a non-volatile memory express driver. Alternatively, the operating system independent driver may be embodied as a non-volatile memory express over fabric driver. In facilitating the communication, the bridge logic unit communicator 1810 may provide any data resulting from the access request (e.g., data read from the requested device) or from the requestor device to the requested device (e.g., write data to the requested device).

Figure 19:
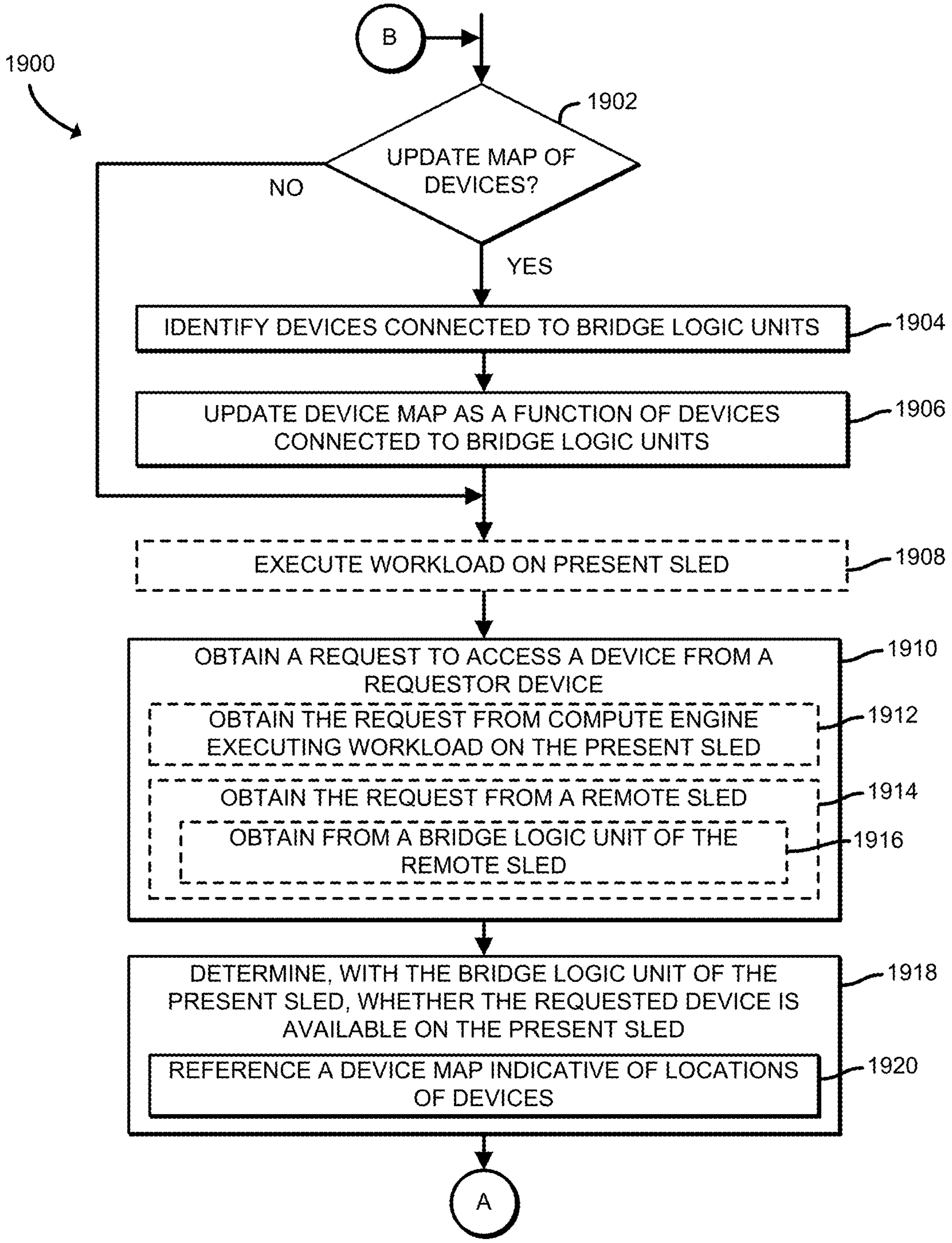
FIGS. 19-20 are a simplified flow diagram of at least one embodiment of a method for providing efficient pooling in hyper converged infrastructure that may be performed by the sled of FIGS. 16-18.

Referring now to FIG. 19, in use, the sled 1604 may execute a method 1900 for providing efficient pooling in a hyper converged infrastructure (e.g., the system 1600). For simplicity, the method 1900 is described below as being performed by the sled 1604. However, in some embodiments, each of the sleds 1604, 1606, 1608 may individually perform the method 1900 either separately or simultaneously. The method begins with block 1902 in which the sled 1604 determines whether an update to a map of devices (e.g., device map data 1812) has been received. In the illustrative embodiment, the sled 1604 may receive updates to the map of devices from the orchestrator server 1602, other sleds 1606, 1608, and/or another compute device (not shown). The sled 1604 may receive an update when a device is added to or removed from the system 1600 (e.g., upon detection by the corresponding sled to which the devices was added to or removed from). If the sled 1604, receives an update, the method 1900 advances to block 1904, in which, the sled 1604 identifies devices connected to bridge logic units 1616, 1628, 1640. However, if there is no update to the map of devices, the method 1900 branches ahead to block 1908, in which, in some embodiments, the sled 1604 executes a workload (e.g., using the CPU 1610). However, referring back to block 1904, subsequent to identifying devices, the sled 1604 updates the device map as a function of the devices connected to bridge logic units 1616, 1628, 1640 in block 1906. For example, the update may indicate that a new memory device has been added, and the sled 1604 may, in response, add the new memory device to a list of devices coupled to the particular bridge logic unit 1616, 1628, 1640 that is associated with the new memory device. Similarly, the sled 1604 may remove device(s) 1614, 1626, 1638 from the list in the instance the device(s) 1614, 1626, 1638 is removed.

In block 1910, the sled 1604 obtains a request to access device(s) 1614, 1626, 1638 from a requestor device. The requestor device may be embodied as a CPU 1610, 1622, 1634 executing a workload, for example, as described in block 1908. In some embodiments, in block 1912, the sled 1604 obtains the request from the compute engine 1702 that is executing the workload on the present sled 1604. Alternatively, in block 1914, the sled 1604 may obtain the request from a remote sled (e.g., a different sled, such as one of sleds 1606, 1608). To do so, the sled 1604 may obtain the request from a bridge logic unit 1628, 1640 of the remote sled 1606, 1608 as indicated in block 1916. After obtaining the request to access a device, the method advances to block 1918, in which the sled 104 determines, with the bridge logic unit 1616, whether the requested device is available on the sled 1604. To do so, in the illustrative embodiment, in block 1920, the sled 1604 references a device map indicative of a location of the requested device. For example, the device map may indicate which sled 1604, 1606, 1608 the requested device is located on. In addition, in some embodiments, the device map may indicate which bridge logic unit 1616, 1628, 1640 the requested device is communicatively coupled to, thereby identifying which bridge logic unit 1616, 1628, 1640 to communicate with to access the requested device.

Figure 20:
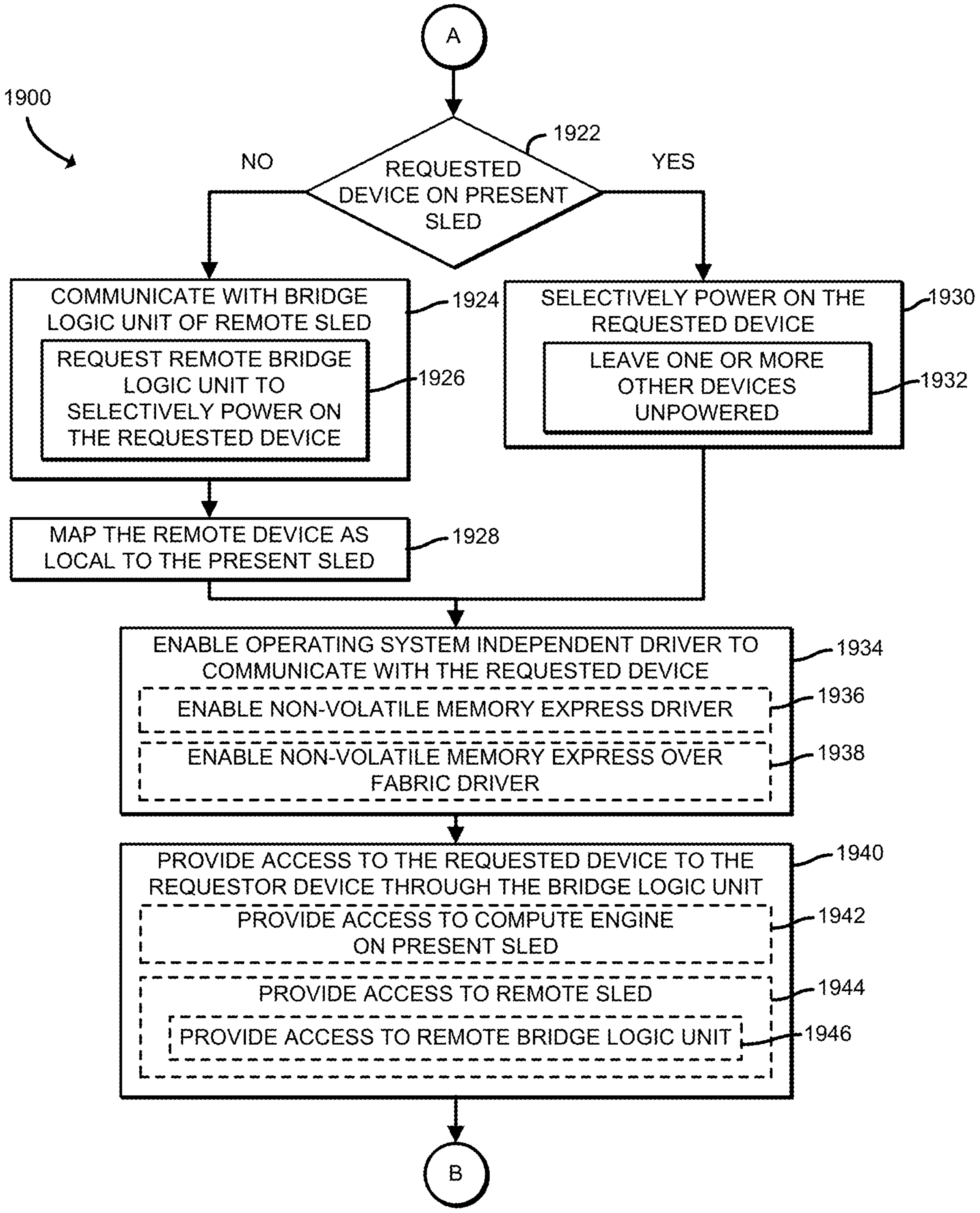

Referring now to FIG. 20, in block 1922, the sled 1604 determines whether the requested device is on the present sled 1604. If the sled 1604 determines that the requested device is not on the present sled 1604, the method 1900 advances to block 1924 in which the sled 1604 communicates with the bridge logic unit 1628, 1640 of the remote sled 1606, 1608. However, if the sled 1604 determines that the requested device is located on the present sled 1604, the method advances to block 1930 in which the sled 1604 selectively powers on the requested device (e.g., device(s) 1614). In the illustrative embodiment, the sled 1604 powers on the requested device through the bridge logic unit 1616. In addition, in selectively powering on the requested device, the sled 1604 may leave one or more other devices present on the sled 1604 unpowered, as indicated in block 1932. However, referring back to block 1924, in communicating with the bridge logic unit 1628, 1640, the sled 1604 requests the remote bridge logic unit 1628, 1640 to selectively power on the requested device, as indicated in block 1926. For example, the bridge logic unit 1616 may send a request to power on a memory device 1630 coupled to the bridge logic unit 1628 or to power on data storage device 1642 coupled to the bridge logic unit 1640. After communicating with the bridge logic unit 1628, 1640 of the remote sled 1606, 1608, the method 1900 advances to block 1928 in which the sled 1604 maps the remote device as being local to the present sled 1604.

In block 1934, the sled 1604 enables an operating system independent driver to communicate with the requested device. To do so, in some embodiments, the sled 1604 enables a non-volatile memory express driver, in block 1936. Alternatively, the sled 1604 may enable a non-volatile memory express over fabric driver, in block 1938. In other embodiments, the sled 1604 enables another type of operating system independent driver.

In block 1940, the sled 1604 provides access to the requested device (e.g., device(s) 1614, 1626, 1638) to the requestor device (e.g., CPU 1610, 1622, 1634, and/or another device) through the local bridge logic unit 1616. In some embodiments, in block 1942, the sled 1604 provides access to the compute engine 1702 on the sled 1604. For example, the bridge logic unit 1616 may provide, to the compute engine 1702, access to a requested accelerator device 1618 on the present sled 1604. Alternatively, in some embodiments, in block 1944, the sled 1604 provides access to the requested device to a remote sled 1606, 1608. For instance, the sled 1604 provides access to a requested accelerator device 1618 to sled 1606 through the bridge logic unit 1616. In doing so, the sled 1604 provides the access to the bridge logic unit (e.g., the bridge logic unit 1628) of the remote sled (e.g., the sled 1606), which in turn may map the device as being local to the sled 1606. Subsequently, the method 1900 returns to block 1902 of FIG. 19 to continue monitoring whether an update has been received.

EXAMPLES

Illustrative examples of the technologies disclosed herein are provided below. An embodiment of the technologies may include any one or more, and any combination of, the examples described below.

Example 1 includes a sled comprising a network interface controller that includes a first bridge logic unit to communicatively couple to a network of bridge logic units of other sleds, wherein the first bridge logic unit is further to obtain, from a requestor device, a request to access a requested device; determine whether the requested device is on the present sled or on a remote sled different from the present sled; selectively power on, in response to a determination that the requested device is located on the present sled, the requested device; communicate, in response to a determination that the requested device is on the remote sled, with a second bridge logic unit of the remote sled; and provide, to the requestor device through the first bridge logic unit, access to the requested device.

Example 2 includes the subject matter of Example 1, and wherein the first bridge logic unit is further to receive a map of devices coupled to the network of bridge logic units from a compute device.

Example 3 includes the subject matter of any of Examples 1 and 2, and wherein the first bridge logic unit is further to receive a map of devices coupled to the network of bridge logic units from an orchestrator server communicatively coupled to the sled.

Example 4 includes the subject matter of any of Examples 1-3, and wherein the requested device includes at least one of a memory device, a data storage device, or an accelerator device.

Example 5 includes the subject matter of any of Examples 1-4, and wherein the accelerator device includes a field-programmable gate array (FPGA).

Example 6 includes the subject matter of any of Examples 1-5, and wherein the sled further comprises a compute engine to execute a workload on the sled.

Example 7 includes the subject matter of any of Examples 1-6, and wherein to obtain the request to access the device comprises to obtain the request from the compute engine that the workload is executed on.

Example 8 includes the subject matter of any of Examples 1-7, and wherein to obtain the request to access the device comprises to obtain the request from the remote sled.

Example 9 includes the subject matter of any of Examples 1-8, and wherein to obtain the request from the remote sled comprises to obtain the request from the second bridge logic unit of the remote sled.

Example 10 includes the subject matter of any of Examples 1-9, and wherein to determine whether the requested device is on the sled comprises to reference a device map indicative of locations of a plurality of devices.

Example 11 includes the subject matter of any of Examples 1-10, and wherein to communicate with the second bridge logic unit of the remote sled comprises to request the second bridge logic unit to selectively power on the requested device.

Example 12 includes the subject matter of any of Examples 1-11, and wherein the first bridge logic unit is further to map the requested device as local to the sled.

Example 13 includes the subject matter of any of Examples 1-12, and wherein the sled is a memory sled, a data storage sled, or an accelerator sled.

Example 14 includes the subject matter of any of Examples 1-13, and wherein the first bridge logic unit is further to enable an operating system independent driver to communicate with the requested device.

Example 15 includes the subject matter of any of Examples 1-14, and wherein to enable an operating system independent driver comprises to enable a non-volatile memory express driver.

Example 16 includes the subject matter of any of Examples 1-15, and wherein to enable an operating system independent driver comprises to enable non-volatile memory express over fabric driver.

Example 17 includes the subject matter of any of Examples 1-16, and wherein to provide, to the requestor device, access to the requested device comprises to provide, to a compute engine on the sled, access to the requested device.

Example 18 includes the subject matter of any of Examples 1-17, and wherein to provide access to the requested device comprises to provide access to the remote sled.

Example 19 includes the subject matter of any of Examples 1-18, and wherein to provide access to the remote sled comprises to provide access to the second bridge logic unit of the remote sled.

Example 20 includes a method for accessing a device, the method comprising obtaining, with a first bridge logic unit of a network interface controller coupled to a network of bridge logic units, a request from a requestor device to access a requested device; determining, by the first bridge logic unit, whether the requested device is on the present sled or on a remote sled different from the present sled; selectively powering on, by the first bridge logic unit and in response to determining that the requested device is located on the sled, the requested device or communicating, by the first bridge logic unit and in response to a determination that the requested device is on the remote sled, with a second bridge logic unit of the remote sled; and providing, by the first bridge logic unit and to the requestor device, access to the requested device.

Example 21 includes the subject matter of Example 20, and further including receiving, by the first bridge logic unit, a map of devices coupled to the network of bridge logic units from a compute device.

Example 22 includes the subject matter of any of Examples 20 and 21, and further including receiving, by the first bridge logic unit, a map of devices coupled to the network of bridge logic units from an orchestrator server communicatively coupled to the sled.

Example 23 includes the subject matter of any of Examples 20-22, and wherein obtaining a request to access a device comprises obtaining a request to access at least one of a memory device, a data storage device, or an accelerator device.

Example 24 includes the subject matter of any of Examples 20-23, and wherein obtaining a request to access an accelerator device comprises obtaining a request to access a field-programmable gate array (FPGA).

Example 25 includes the subject matter of any of Examples 20-24, and further including executing, by a compute engine on the sled, a workload.

Example 26 includes the subject matter of any of Examples 20-25, and wherein obtaining the request to access the device comprises obtaining the request from the compute engine that is executing the workload.

Example 27 includes the subject matter of any of Examples 20-26, and wherein obtaining the request to access the device comprises obtaining the request from the remote sled.

Example 28 includes the subject matter of any of Examples 20-27, and wherein obtaining the request from the remote sled comprises obtaining the request from the second bridge logic unit of the remote sled.

Example 29 includes the subject matter of any of Examples 20-28, and wherein determining whether the requested device is on the sled comprises referencing a device map indicative of locations of a plurality of devices.

Example 30 includes the subject matter of any of Examples 20-29, and wherein communicating with the second bridge logic unit of the remote sled comprises requesting the second bridge logic unit to selectively power on the requested device.

Example 31 includes the subject matter of any of Examples 20-30, and further including mapping, by the first bridge logic unit, the requested device as local to the sled.

Example 32 includes the subject matter of any of Examples 20-31, and wherein determining whether the requested device is on the present sled or a remote sled comprises determining whether the requested device is on a memory sled, a data storage sled, or an accelerator sled.

Example 33 includes the subject matter of any of Examples 20-32, and further including enabling, by the first bridge logic unit, an operating system independent driver to communicate with the requested device.

Example 34 includes the subject matter of any of Examples 20-33, and wherein enabling an operating system independent driver comprises enabling a non-volatile memory express driver.

Example 35 includes the subject matter of any of Examples 20-34, and wherein enabling an operating system independent driver comprises enabling a non-volatile memory express over fabric driver.

Example 36 includes the subject matter of any of Examples 20-35, and wherein providing access to the requested device comprises providing access to a compute engine on the sled.

Example 37 includes the subject matter of any of Examples 20-36, and wherein providing access to the requested device comprises providing access to the remote sled.

Example 38 includes the subject matter of any of Examples 20-37, and wherein providing access to the remote sled comprises providing access to the second bridge logic unit of the remote sled.

Example 39 includes one or more machine-readable storage media comprising a plurality of instructions stored thereon that, in response to being executed, cause a sled to perform the method of any of Examples 20-38.

Example 40 includes a sled comprising means for performing the method of any of Examples 20-38.

Example 41 includes a sled comprising one or more processors; one or more memory devices having stored therein a plurality of instructions that, when executed by the one or more processors, cause the sled to perform the method of any of Examples 20-38.

Example 42 includes a sled comprising a network interface controller that includes a first bridge link interfacer circuitry to communicatively couple to a network of bridge link interfacer circuitries of other sleds, wherein the first bridge link interfacer circuitry is further to obtain, from a requestor device, a request to access a requested device; determine whether the requested device is on the present sled or on a remote sled different from the present sled; selectively power on, in response to a determination that the requested device is located on the present sled, the requested device; communicate, in response to a determination that the requested device is on the remote sled, with a second bridge interfacer circuitry of the remote sled; and provide, to the requestor device, access to the requested device.

Example 43 includes the subject matter of Example 42, and wherein the first bridge interfacer circuitry is further to receive a map of devices coupled to the network of bridge logic units from a compute device.

Example 44 includes the subject matter of any of Examples 42 and 43, and wherein the first bridge interfacer circuitry is further to receive a map of devices coupled to the network of bridge logic units from an orchestrator server communicatively coupled to the sled.

Example 45 includes the subject matter of any of Examples 42-44, and wherein the requested device includes at least one of a memory device, a data storage device, or an accelerator device.

Example 46 includes the subject matter of any of Examples 42-45, and wherein the accelerator device includes a field-programmable gate array (FPGA).

Example 47 includes the subject matter of any of Examples 42-46, and wherein the sled further comprises a compute engine to execute a workload on the sled.

Example 48 includes the subject matter of any of Examples 42-47, and wherein to obtain the request to access the device comprises to obtain the request from the compute engine that the workload is executed on.

Example 49 includes the subject matter of any of Examples 42-48, and wherein to obtain the request to access the device comprises to obtain the request from the remote sled.

Example 50 includes the subject matter of any of Examples 42-49, and wherein to obtain the request from the remote sled comprises to obtain the request from the second bridge logic unit of the remote sled.

Example 51 includes the subject matter of any of Examples 42-50, and wherein to determine whether the requested device is on the sled comprises to reference a device map indicative of locations of a plurality of devices.

Example 52 includes the subject matter of any of Examples 42-51, and wherein to communicate with the second bridge interfacer circuitry of the remote sled comprises to request the second bridge interfacer circuitry to selectively power on the requested device.

Example 53 includes the subject matter of any of Examples 42-52, and wherein the first bridge interfacer circuitry is further to map the requested device as local to the sled.

Example 54 includes the subject matter of any of Examples 42-53, and wherein the sled is a memory sled, a data storage sled, or an accelerator sled.

Example 55 includes the subject matter of any of Examples 42-54, and wherein the first bridge interfacer circuitry is further to enable an operating system independent driver to communicate with the requested device.

Example 56 includes the subject matter of any of Examples 42-55, and wherein to enable an operating system independent driver comprises to enable a non-volatile memory express driver.

Example 57 includes the subject matter of any of Examples 42-56, and wherein to enable an operating system independent driver comprises to enable non-volatile memory express over fabric driver.

Example 58 includes the subject matter of any of Examples 42-57, and wherein to provide, to the requestor device, access to the requested device comprises to provide, to a compute engine on the sled, access to the requested device.

Example 59 includes the subject matter of any of Examples 42-58, and wherein to provide access to the requested device comprises to provide access to the remote sled.

Example 60 includes the subject matter of any of Examples 42-59, and wherein to provide access to the remote sled comprises to provide access to the second bridge logic unit of the remote sled.

Example 61 includes a sled comprising circuitry for obtaining a request from a requestor device to access a requested device; circuitry for determining whether the requested device is on the present sled or on a remote sled different from the present sled; means for selectively powering on, in response to determining that the requested device is located on the sled, the requested device or communicating, in response to a determination that the requested device is on the remote sled, with a bridge logic unit of the remote sled; and circuitry for providing, by the first bridge logic unit and to the requestor device, access to the requested device.

Example 62 includes the subject matter of Example 61, and further including circuitry for receiving a map of devices coupled to a network of bridge logic units from a compute device.

Example 63 includes the subject matter of any of Examples 61 and 62, and further including circuitry for receiving a map of devices coupled to a network of bridge logic units from an orchestrator server communicatively coupled to the sled.

Example 64 includes the subject matter of any of Examples 61-63, and wherein the circuitry for obtaining a request to access a device comprises circuitry for obtaining a request to access at least one of a memory device, a data storage device, or an accelerator device.

Example 65 includes the subject matter of any of Examples 61-64, and wherein the circuitry for obtaining a request to access an accelerator device comprises circuitry for obtaining a request to access a field-programmable gate array (FPGA).

Example 66 includes the subject matter of any of Examples 61-65, and further including circuitry for executing a workload.

Example 67 includes the subject matter of any of Examples 61-66, and wherein the circuitry for obtaining the request to access the device comprises circuitry for obtaining the request from a compute engine that is executing the workload.

Example 68 includes the subject matter of any of Examples 61-67, and wherein the circuitry for obtaining the request to access the device comprises circuitry for obtaining the request from the remote sled.

Example 69 includes the subject matter of any of Examples 61-68, and wherein the circuitry for obtaining the request from the remote sled comprises circuitry for obtaining the request from the bridge logic unit of the remote sled.

Example 70 includes the subject matter of any of Examples 61-69, and wherein the circuitry for determining whether the requested device is on the sled comprises circuitry for referencing a device map indicative of locations of a plurality of devices.

Example 71 includes the subject matter of any of Examples 61-70, and wherein the circuitry for communicating with the bridge logic unit of the remote sled comprises circuitry for requesting the bridge logic unit to selectively power on the requested device.

Example 72 includes the subject matter of any of Examples 61-71, and further including circuitry for mapping the requested device as local to the sled.

Example 73 includes the subject matter of any of Examples 61-72, and wherein the circuitry for determining whether the requested device is on the present sled or a remote sled comprises circuitry for determining whether the requested device is on a memory sled, a data storage sled, or an accelerator sled.

Example 74 includes the subject matter of any of Examples 61-73, and further including circuitry for enabling an operating system independent driver to communicate with the requested device.

Example 75 includes the subject matter of any of Examples 61-74, and wherein the circuitry for enabling an operating system independent driver comprises circuitry for enabling a non-volatile memory express driver.

Example 76 includes the subject matter of any of Examples 61-75, and wherein the circuitry for enabling an operating system independent driver comprises circuitry for enabling a non-volatile memory express over fabric driver.

Example 77 includes the subject matter of any of Examples 61-76, and wherein the circuitry for providing access to the requested device comprises circuitry for providing access to a compute engine on the sled.

Example 78 includes the subject matter of any of Examples 61-77, and wherein the circuitry for providing access to the requested device comprises circuitry for providing access to the remote sled.

Example 79 includes the subject matter of any of Examples 61-78, and wherein the circuitry for providing access to the remote sled comprises circuitry for providing access to the bridge logic unit of the remote sled.

The invention claimed is:

1. An apparatus comprising:

an Ethernet network interface controller (NIC) to be coupled with a host compute device, the Ethernet NIC to include a first interface to communicatively couple with a host central processing unit (CPU) and a second interface to communicatively couple with a network of one or more storage servers, wherein the Ethernet NIC also includes circuitry to:

obtain, from the host CPU, a request to access a data storage device;

enable a non-volatile memory express driver; and based on whether the data storage device is located on the host compute device or accessible through a storage server from among the one or more network of storage servers, provide, to the host CPU, access to the data storage device via use of the non-volatile memory express driver.

2. The apparatus of claim 1, the data storage device is located on the storage server, wherein to provide access to the host CPU to the data storage device via use of the non-volatile memory express driver is to include presenting the data storage device as being local to the host compute device.

3. The apparatus of claim 1, wherein a data storage device map indicative of locations of a plurality of data storage devices is used to determine whether the data storage device is located on the host compute device or located on the storage server.

4. The apparatus of claim 3, wherein the circuitry is to receive the data storage device map from an orchestrator server communicatively coupled to the circuitry.

5. The apparatus of claim 1, the data storage device is located on the storage server, wherein the circuitry is further to:

cause the data storage device to be powered on at the storage server based on a request sent to a second circuitry of a second Ethernet NIC located at the storage server to power on the data storage device.

6. The apparatus of claim 1, wherein the host CPU is to execute a workload on the host compute device.

7. The apparatus of claim 1, the circuitry comprises a field-programmable gate array (FPGA).

8. One or more non-transitory machine-readable storage media comprising a plurality of instructions stored thereon that, in response to being executed, cause circuitry of an Ethernet network interface controller (NIC) to be coupled with a host compute device to:

obtain, via a first interface coupled with a host central processing unit (CPU), a request from the host CPU to access a data storage device;

enable a non-volatile memory express driver; and based on whether the data storage device is located on the host compute device or accessible through a storage server from among a network of one or more storage servers coupled to the circuitry via a second interface, provide, to the host CPU, access to the data storage device via use of the non-volatile memory express driver.

9. The one or more non-transitory machine-readable storage media of claim 8, the data storage device is located on the storage server, wherein to provide access to the host CPU to the data storage device via use of the non-volatile memory express driver is to include presenting the data storage device as being local to the host compute device.

10. The one or more non-transitory machine-readable storage media of claim 8, wherein a data storage device map indicative of locations of a plurality of data storage devices is used to determine whether the data storage device is located on the host compute device or located on the storage server.

11. The one or more non-transitory machine-readable storage media of claim 10, wherein the plurality of instructions further cause the circuitry to receive the data storage device map from an orchestrator server communicatively coupled to the circuitry.

12. The one or more non-transitory machine-readable storage media of claim 8, the data storage device is located on the storage server, wherein the instructions are to further cause the circuitry to:

cause the data storage device to be powered on at the storage server based on a request sent by the circuitry to a second circuitry of a second Ethernet NIC located at the storage server to power on the data storage device.

13. The one or more non-transitory machine-readable storage media of claim 8, wherein the host CPU is to execute a workload on the host compute device.

14. A method for accessing a data storage device, the method comprising:

obtaining, with circuitry of an Ethernet network interface controller (NIC) to be coupled with a host computing device that includes a first interface to communicatively couple with a host central processing unit (CPU) and a second interface to communicatively couple to a network of one or more storage servers, a request from the host CPU to access a data storage device;

enabling a non-volatile memory express driver; and based on whether the data storage device is located on the host compute device or accessible through a storage server from among the one or more network of storage servers, providing, by the circuitry, access to the data storage device by the host CPU via use of the non-volatile memory express driver.

15. The method of claim 14, the data storage device is located on the storage server, wherein to provide access to the data storage device by the host CPU via use of the non-volatile memory express driver is to include presenting the data storage device as being local to the host compute device.

16. The method of claim 14, wherein a data storage device map indicative of locations of a plurality of data storage devices is used for determining whether the data storage device is located on the host compute device or located on the storage server.

17. The method of claim 16, further comprising:

receiving, with the circuitry, the data storage device map from an orchestrator server communicatively coupled to the circuitry.

18. The method of claim 14, further comprising:

causing, with the circuitry, the data storage device to be powered on at the storage server based on a request sent by the circuitry to a second circuitry of a second Ethernet NIC located at the storage server to power on the data storage device.

19. The method of claim 14, wherein the host CPU is to execute a workload on the host compute device.

* * * * *